United States Patent
Kim et al.

(10) Patent No.: US 7,012,239 B2
(45) Date of Patent: Mar. 14, 2006

(54) SILICON OPTOELECTRONIC DEVICE AND IMAGE INPUT/OUTPUT DEVICE USING THE SILICON OPTOELECTRONIC DEVICE

(75) Inventors: Jun-young Kim, Gunpo (KR); Byoung-Iyong Choi, Seoul (KR); Eun-kyung Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 258 days.

(21) Appl. No.: 10/716,665

(22) Filed: Nov. 20, 2003

(65) Prior Publication Data

US 2004/0113051 A1    Jun. 17, 2004

(30) Foreign Application Priority Data

Nov. 20, 2002   (KR) ............... 10-2002-0072408

(51) Int. Cl.
*H01L 31/00*   (2006.01)
(52) U.S. Cl. ..................... 250/214.1; 257/80
(58) Field of Classification Search ............. 250/214.1; 257/80
See application file for complete search history.

(56) References Cited

U.S. PATENT DOCUMENTS 6,147,366 A * 11/2000 Drottar et al. ............... 257/82
6,664,744 B1 * 12/2003 Dietz ........................ 315/291

* cited by examiner

*Primary Examiner*—Seung C. Sohn
(74) *Attorney, Agent, or Firm*—Lee & Morse, P.C.

(57) ABSTRACT

A silicon optoelectronic device includes an optoelectronic device portion and a switching portion. The switching portion selectively controls the emission and detection of light by the optoelectronic device portion. The optoelectronic device portion includes: a doped region of the opposite type to an n- or p-type silicon-based substrate, in which emission and detection of light occurs due to quantum confinement effect at the p-n junction between the doped region and the substrate, and at least one semiconductor material region formed on the rear surface of the substrate, at least a portion of which forms a stack structure with the doped region so that a built-in transistor is formed. The silicon optoelectronic device allows selective light emission and detection without any external amplifying and switching circuits, easy control the duration of light emission and detection, and can be manufactured in a series of semiconductor fabrication process.

50 Claims, 12 Drawing Sheets

LONGITUDINAL QW

LATERAL QW

SILICON OPTOELECTRONIC DEVICE AND IMAGE INPUT/OUTPUT DEVICE USING THE SILICON OPTOELECTRONIC DEVICE

BACKGROUND OF THE INVENTION

1. Field of the Invention

The present invention relates to a silicon optoelectronic device and an image input/output device using the silicon optoelectronic device, and more particularly, to a silicon optoelectronic device capable of both emitting and detecting light and an image input/output device using the silicon optoelectronic device to input/output a picture signal on a pixel-by-pixel basis.

2. Description of the Related Art

Most integrated circuits use silicon (Si) as their base material. Si substrates ensure excellent reliability and high integration density when integrating logic elements, operational elements, and drive elements within the substrate. Further, since Si is low in price, Si can be used to realize highly integrated circuits more cheaply than compound semiconductors.

However, Si has an indirect transition energy band gap that makes light emission therefrom difficult. Therefore, light-emitting devices, such as a light emitting diode (LED), are usually fabricated using compound semiconductor materials that have a direct transition band gap and provide excellent light-emitting properties.

These light-emitting devices emit light only when a current exceeding a predetermined threshold is applied. Thus, in order to supply current at an appropriate level, each light-emitting device requires an amplifying circuit and/or a switching circuit. The amplifying circuit amplifies a small amount of current to a level that causes a light-emitting device to oscillate. The switching circuit controls on/off operation for light emission.

The resultant hybrid junctions make it impractical to integrally fabricate the light-emitting devices made of compound semiconductor materials with amplifying circuits and/or switching circuits made of Si in a semiconductor fabrication process. Thus, it is necessary to install amplifying circuits and/or switching circuits fabricated in a process separate from that for making the light-emitting device. However, providing such separately fabricated amplifying circuits makes high speed switching difficult, due to reactance and capacitance parasitic effects arising from the external power lines.

When using an array of light-emitting elements made of compound semiconductor materials as a display device, for example, switching circuits need to be provided outside each of the light-emitting elements so that light emission can occur on a pixel-by-pixel basis. However, such external provision makes it difficult to control the turn-on and turn-off time of current used for light emission on a pixel-by-pixel basis, which hinders control of the duration of light emission.

There is also an increasing demand for taking and transmitting photographs to others and/or displaying a photograph sent from others, especially over the Internet and mobile phones. To meet this increasing demand, as shown in FIG. 1, a separate camera 2 has been installed in a computer system in addition to a monitor 1 for displaying an image. This allows an operator to view, send and transmit photographs. In FIG. 1, the computer system also includes a central processing unit (CPU) 3 and a keyboard 4 or other interactive device. Since a conventional display device such as a typical computer monitor 1 can simply display images, a separate camera 2 is required to photograph an object desired by an operator in order to make visual communications with the other party.

In order to photograph oneself while being able to see the display device, the operator has to position a camera away from the display device. Thus, it is impossible to photograph the operator right in front of the image viewed on the display device, which reduces the vividness in interactive visual communications.

SUMMARY OF THE INVENTION

It is a feature of an embodiment of the present invention to provide a silicon optoelectronic device formed on a silicon based substrate, and which has at least one of the following features: built-in circuits for performing switching and/or amplifying functions so that light emission and detection can occur selectively; easy control of the duration of light emission and detection; and manufacturablity in a series of semiconductor fabrication process.

It is another feature of an object of the present invention to provide an image input/output device using an array of the silicon optoelectronic devices, which enables light emission and detection for each pixel. The image input/output device makes it possible to display an image on a single panel, generate an electrical image signal by photographing the desired object without being prohibited from viewing the image displayed, or to directly input optical information into a screen, thus allowing bi-directional transmission of visual information.

At least one of the above and other features may be realized by providing a silicon optoelectronic device including: an n- or p-type silicon-based substrate; an optoelectronic device portion including a doped region which is ultra-shallowly doped with a predetermined dopant to be the opposite type to the substrate on a portion of the substrate so that emission and detection of light may occur, and a built-in one-step transistor; a switching portion formed on one side of the optoelectronic device portion and shared with the substrate, the switching portion selectively controlling emission and detection of light by the optoelectronic device portion; and an electrode structure supplies an electrical signal the optoelectronic device portion and switching portion for controlling emission and detection of light and/or outputs a light detection signal.

The built-in transistor may include a plurality of semiconductor material regions formed on a rear surface of the substrate. At least one portion of the plurality of semiconductor material regions and the doped region form a stack structure. The semiconductor material regions adjacent to the substrate have the opposite conductivity type to the substrate. The neighbouring semiconductor material regions have the opposite conductive types to each, thereby providing a built-in transistor of at least two steps.

The built-in transistor may include a semiconductor material region formed on a portion of a rear surface of the substrate, the semiconductor material region having the opposite conductivity type to the substrate and forms a stack structure with the doped region so that the optoelectronic device has a built-in one-step transistor.

The electrode structure may include: when a semiconductor material region positioned at the outermost side of the portion of the optoelectronic device portion having the stack structure is a first semiconductor material region, and a semiconductor material region adjacent to the inside of the first semiconductor material region is a second semiconductor material region, a first gate electrode electrically connected to the second semiconductor material region; a first gate electrode electrically connected to the doped region; and a second electrode electrically connected to the second semiconductor material region.

The electrode structure may further include an insulating film formed on a portion of the second semiconductor material region and a high resistance material layer, on which the first gate electrode is formed, formed on the insulating film and the second semiconductor material region. The first gate electrode may electrically connect with the second semiconductor material region on a narrow region by the insulating film, with the high resistance material layer being formed between the first gate electrode and the second semiconductor material region.

The switching portion may have a metal-oxide-semiconductor field effect transistor (MOSFET) structure. The electrode structure may further include a second gate electrode and third and fourth electrodes, all of which are provided on the switching portion. Furthermore, either the third or fourth electrode may be electrically connected to the doped region.

The switching portion may have a bipolar junction transistor structure, and the electrode structure may further include base, emitter, and collector electrodes provided in the switching portion. The switching portion may be formed by a base on the substrate by doping, an emitter on the base by doping, and a collector on one side of the base by doping. In this case, a gap between the boundaries of the base and emitter on the side of the collector is sufficiently narrow to allow a majority of the charges to reach the collector.

At least one of the above and other features may be realized by providing an image input/output device having a silicon optoelectronic device panel including a plurality of silicon optoelectronic devices capable of inputting and outputting image arranged on an n- or p-type silicon based substrate in a two-dimensional array. Each silicon optoelectronic device includes elements noted above. The electrode structure may be patterned to selectively control the input and output of images to and from the silicon optoelectronic device panel on a pixel-by-pixel basis.

Each pixel in the silicon optoelectronic device panel may have at least three silicon optoelectronic devices for emitting and detecting light corresponding thereto. The at least three silicon optoelectronic devices corresponding to each pixel may be designed to emit and/or detect different wavelengths of light for representing a color image.

The image input/output device may further include a color filter for displaying a distinct color image on the front of the silicon optoelectronic device panel. Furthermore, the device may be responsive to an optical remote control used to input information, e.g., into a screen or select a menu on the screen.

BRIEF DESCRIPTION OF THE DRAWINGS

The above and other features and advantages of the present invention will become readily apparent to those of skill in the art be describing in detail embodiments thereof with reference to the attached drawings, in which.

DETAILED DESCRIPTION

Figure 1:
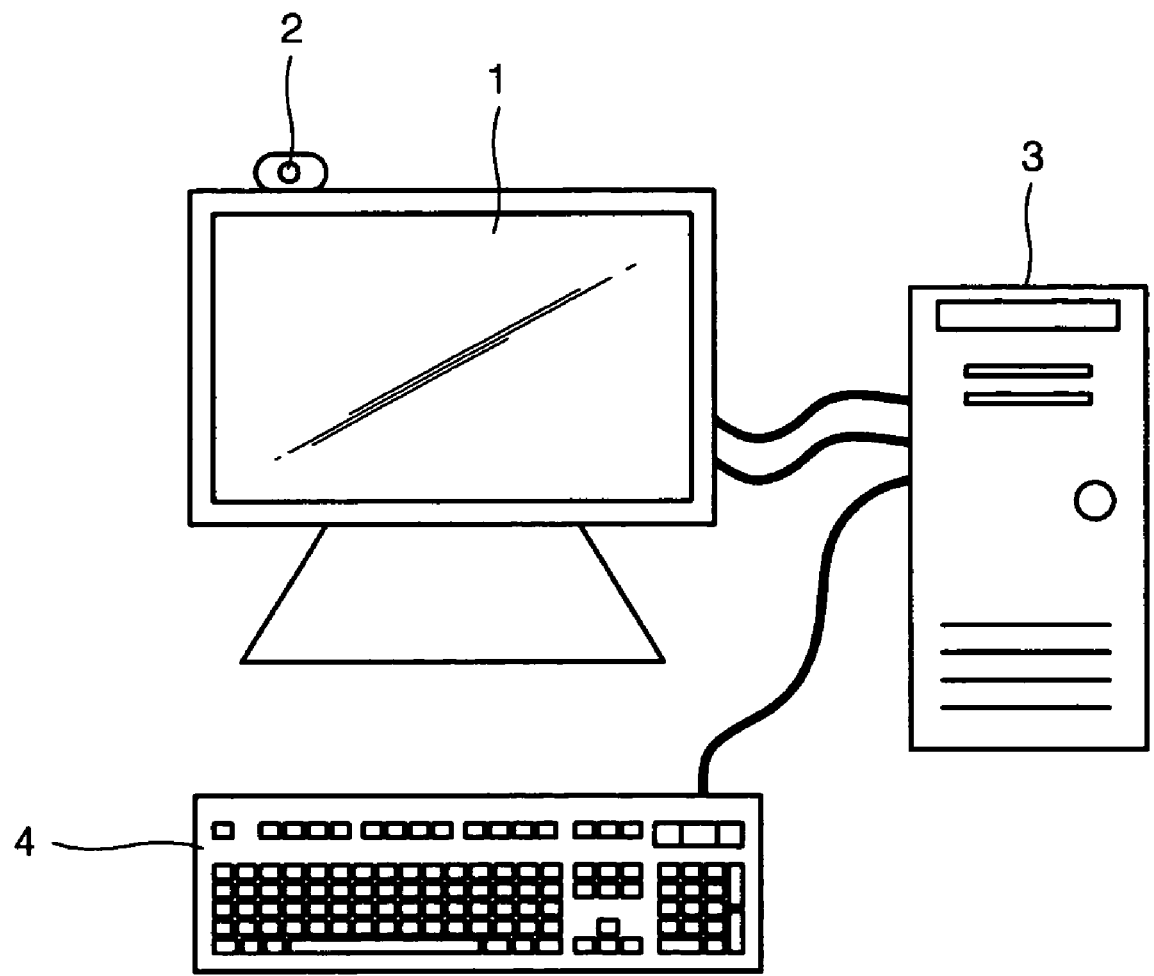
FIG. 1 is a schematic illustration of a typical computer system.

Korean Patent Application No. 2002-72408, filed on Nov. 20, 2002, in the Korean Intellectual Property Office and entitled "Silicon Optoelectronic Device and Image Input/Output Device Using the Silicon Optoelectronic Device", is incorporated herein by reference in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout.

Figure 2:
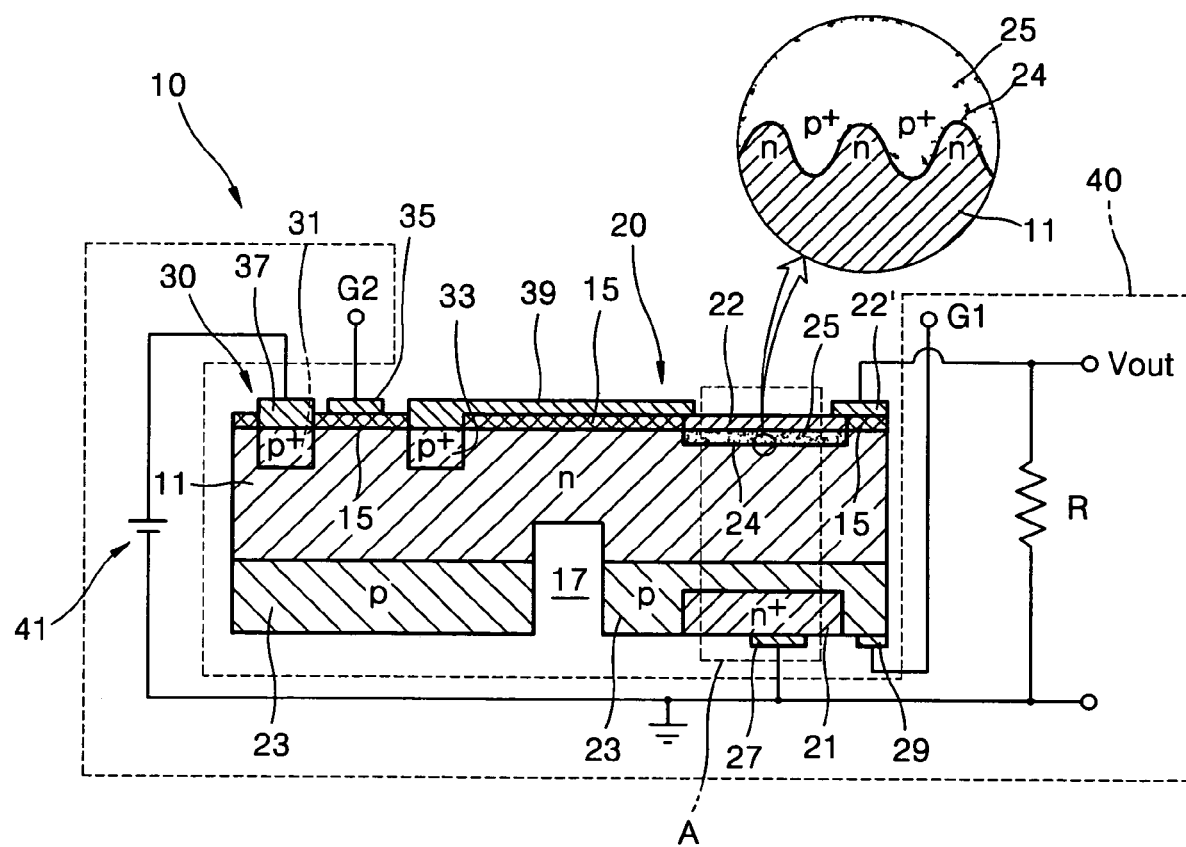
FIG. 2 is a schematic illustration of a silicon optoelectronic device according to a first embodiment of the present invention and its external driving circuit.

Referring to FIG. 2, a silicon optoelectronic device 10 according to a first embodiment includes an n- or p-type silicon-based substrate 11, an optoelectronic device portion 20 for emitting and detecting light, a switching portion 30 formed on one side of the optoelectronic device portion 20, with which the substrate 11 is shared, for selecting emission or detection of light, and an electrode structure, discussed in detail below, that receives an electrical signal and/or power for controlling emission and detection of light by the optoelectronic device portion 20 and switching portion 30 and outputs a light detection signal.

The substrate 11 may be a silicon-based semiconductor substrate of a predetermined semiconductor material containing silicon (Si) such as Si, silicon carbide (SiC), or diamond, and doped with n- or p-type material.

The optoelectronic device portion 20 includes a ultra-shallowly doped region 25 of the opposite type to a substrate 11 formed on a portion of the substrate 11 and a plurality of semiconductor material regions 21 and 23 formed on the rear surface of the substrate 11, at least one portion of which forms a stack structure (portion A indicated by the dotted line in FIG. 2) with the doped region 25. The optoelectronic device portion 20 is constructed to have a transistor of two or more steps built-in.

A dopant may be injected into the substrate 11, e.g., using non-equilibrium diffusion or implantation, to form the doped region 25. For example, the doped region 25 of the opposite doping type to the substrate 11 such as p+-type is formed by injecting a predetermined dopant such as boron or phosphorous into the substrate 11 via an opening of a control film (not shown) by non-equilibrium diffusion. In other words, if the substrate 11 is doped with n-type, the doped region 25 is doped with p+-type. On the other hand, if the substrate 11 is doped with p-type, the doped region 25 is doped with n+-type.

The control film acts as a mask when forming the doped region 25 so that the doped region can be formed to a desired ultra-shallow thickness on the substrate 11. The control film may be removed from the substrate 11 after the doped region 25 has been formed as shown in FIG. 2 or kept on a portion of the substrate 11.

The doped region may be formed to an ultra-shallow depth so that photoelectric conversion effect, i.e., electron-hole pair creation and annihilation, can occur with high quantum efficiency due to quantum confinement effect. This quantum confinement effect is achieved by forming at least one of quantum wells, quantum dots, and quantum wires at a p-n junction 24 between the substrate 11 and the doped region 25.

Here, quantum wells, quantum dots, or quantum wires may be formed in the p-n junction 24. A multiple structure including two or more types of quantum wells, quantum dots, or quantum wires may be formed at the p-n junction 24. For simplicity of description, formation of quantum wells only in the p-n junction 24 will be described below. However, the term "quantum wells" as used herein is to mean at least one of quantum wells, quantum dots and quantum wires.

Figure 3:
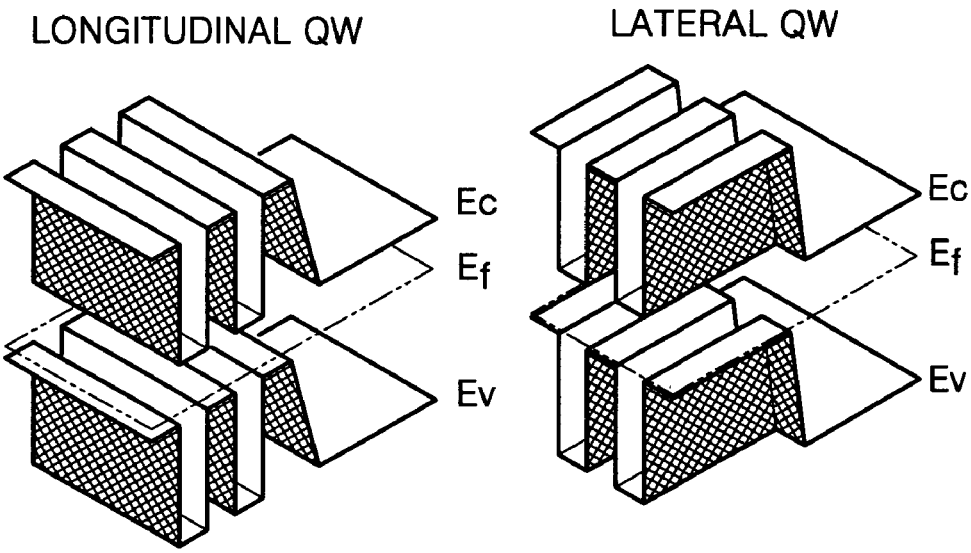
FIG. 3 illustrates energy-bands in longitudinal and lateral quantum wells (QW's) formed in the p-n junction when the doped region of FIG. 2 is formed to a ultra-shallow depth.

FIG. 3 shows energy-bands in longitudinal and lateral quantum wells (QWs) formed in the p-n junction 24 when the doped region 25 is formed to an ultra-shallow depth. In FIG. 3, $E_c$, $E_v$, $E_f$ denote conduction-band, valenceband, and Fermi energy levels, respectively. Since the energy levels are well known in the field of semiconductor technology, a detailed description thereof will be omitted.

As shown in the enlarged portion of FIG. 2, the p-n junction 24 has a QW structure in which doped portions of the opposite conductivity types are alternately formed. Here, for example, the well and barrier are about two and three nm wide, respectively.

By controlling the thickness of the control film and diffusion process conditions, an ultra-shallow p-n junction having QWs may be formed.

The thickness of a diffusion profile may be adjusted to ten-twenty nm, for example, by appropriate diffusion temperature and deformed potential of the surface of the substrate 11 during the diffusion process. A quantum well system is created by the ultra-shallow diffusion profile thus formed. Here, the potential of the surface of the substrate 11 is deformed depending on initial thickness of the control film and surface pre-treatment. The potential deepens as the process proceeds.

The control film may be a silicon oxide ($SiO_2$) layer having a thickness needed to form the doped region 25 to a ultra-shallow depth. The control film may be formed in a mask structure by forming a silicon oxide layer on one surface of the substrate 11 and then etching an opening for performing diffusion, e.g., using photolithography.

As is known in diffusion techniques, when a silicon oxide film is too thick, e.g. several thousand Angstroms, or the diffusion temperature is too low, deep diffusion occurs due to vacancy. When a silicon oxide film is too thin, or the diffusion temperature is too high, deep diffusion occurs due to Si self-interstitial. Thus, when a silicon oxide film is formed to an appropriate thickness to generate Si self-interstitials and vacancies at a similar ratio, Si self-interstitials and vacancies combine to retard dopant diffusion, thereby enabling ultra-shallow doping. Here, since the physical properties of vacancies and self-interstitials are well-known in the field of diffusion technology, a detailed description thereof will be omitted.

The silicon optoelectronic device 10 according to the first embodiment of this invention performs both emission and detection of light as described above, since quantum wells in which electron-hole pair creation and annihilation occur are formed at the p-n junction 24 between the doped region 25 and the substrate 11. That is, if a drive current is applied across the optoelectronic device portion 20, carriers, which are both electrons and holes, are then implanted into a quantum well in the p-n junction 24 and recombined (annihilated) at a sub-band energy level in the quantum well. In this case, electro luminescence (EL) occurs at various wavelengths according to the state in which carriers are recombined, and the quantity of light emitted varies depending on the amount of drive current applied.

Furthermore, when light is incident on the optoelectronic device portion 20, a photon in the incident light is absorbed into the p-n junction 24 having the quantum well structure so that pairs of electron and hole are generated, and electrons and holes are excited at sub-band energy levels in the quantum well formed in the p-n junction 24. Thus, when a load resistor R is connected to an output terminal as shown in FIG. 2, a signal Vout proportional to the amount light incident of the optoelectronic device portion 20 is output.

Micro-cavities due to micro-defects on the substrate 11, more particularly on the surface of the doped region, determine the absorption and emission wavelengths of the optoelectronic device portion 20. Thus, the silicon optoelectronic device 10 with the desired range of absorption and emission wavelengths can be obtained by adjusting the size of micro-cavities during the fabrication process.

The intensity and absorption rate of electro luminescence (EL) can be amplified and increased when the resonance wavelength of micro-cavities created due to micro-defects on the surface of substrate 11 is matched.

By adjusting the size of micro-cavities during the fabrication process, the silicon optoelectronic device 10 according to the first embodiment of the present invention can emit and absorb specific wavelengths of light. Making a variety of sizes of micro-cavities on a single device enables the silicon optoelectronic device 10 to emit and absorb white light. That is, if the micro-cavities have a uniform size, the silicon optoelectronic device 10 emits and absorbs a specific wavelength of light such as red, green, or blue light. On the other hand, if they have various sizes, the silicon optoelectronic device 10 emits and absorbs multiple wavelengths of light, e.g., white light.

The silicon optoelectronic device 10 according to this invention can emit and absorb light with the spectrum spanning the shortest wavelength to the longest, e.g., ranging from ultraviolet (UV) to infrared (IR). This makes it possible for the silicon optoelectronic device 10 to emit and absorb white light.

Here, a micro-cavity is created by deformed potential due to micro-defects formed on the surface of the doped region 25. Thus, the deformed potential can be adjusted to deform quantum wells, which determines the size of micro-cavity. By adjusting the size of micro-cavity, light with desired wavelengths such as red, green or blue light, or white light can be emitted and absorbed.

The silicon optoelectronic device 10 having the ultra-shallowly doped region 25 as described above has high quantum efficiency since a quantum confinement effect occurs due to local variations in potential of charge distribution at the p-n junction 24 of the doped region 25 and a sub-band energy level is formed in the quantum wells.

The plurality of semiconductor material regions 21 and 23 includes a first semiconductor material region 21 positioned at the outermost side of the portion A having the stack structure and a second semiconductor material region 23 adjacent to the inside of the first semiconductor material region 21.

FIG. 2 shows an example in which the optoelectronic device portion 20 of the silicon optoelectronic device 10 has a two-step transistor. The plurality of semiconductor material regions 21 and 23 include of the first and second semiconductor material regions 21 and 23. The optoelectronic device portion 20 may have a built-in transistor of two or more steps.

The first and second semiconductor material regions 21 and 23 may be formed on the rear surface of the substrate 11 by injecting a dopant deeper than that for the doped region 25. For example, the second semiconductor material region 23 may be formed on the rear surface of the substrate 11 by injecting a dopant for doping of opposite type of the substrate 11 using typical diffusion by which the dopant is diffused deeper than that of the doped region 25. Then, the first semiconductor material region 21 may be formed on a portion of the second semiconductor material region 23 by injecting a dopant for doping of opposite type of the second semiconductor material region 23 using the same diffusion process used in forming the second semiconductor material region 23. The first and/or second semiconductor material regions 21 and 23 may also be formed by injecting dopants using an implantation method.

FIG. 2 shows an example in which the second semiconductor material region 23 is formed across the entire rear surface of the substrate 11. An isolation groove 17 providing electrical insulation between the second semiconductor material region 23 is located on the side of the optoelectronic device portion 20 and the second semiconductor material region 23 on the side of the switching portion 30.

Here, the second semiconductor material region 23 may be formed by depositing an opposite conductivity type of semiconductor material to that of the substrate 11, such as p-type semiconductor material on the rear surface of the substrate 11. In this case, the first semiconductor material region 21 may be formed either by etching a portion of the second semiconductor material region 23 and depositing n-type semiconductor material into the etched portion or by injecting a dopant which is opposite type to that of the second semiconductor material region 23 into a portion of the second semiconductor material region 23.

The electrode structure noted above includes a first gate electrode 29 electrically connected to the optoelectronic device portion 20, first and second electrodes 22 and 27, a second gate electrode 35 electrically connected to the switching portion 30, and third and fourth electrodes 37 and 39. A contact electrode 22 electrically connects the first electrode 22 with the resistor R of the external driving circuit 40.

When the first semiconductor material region 21 is positioned at the outermost side of the portion A having the stack structure in the optoelectronic device portion 20 and the second semiconductor material region 23 is adjacent to the inside of the first semiconductor material region 21, the first gate electrode 29 and the second electrode 27 are constructed to electrically connect to the second and first semiconductor material regions 23 and 21, respectively. The second electrode 27 and the first gate electrode 29 may be formed from an opaque electrode metal.

The first electrode 22 is electrically connected to the doped region 25. The first electrode 25 may be formed from a transparent electrode material such as indium tin oxide (ITO) to cover the doped region 25. Alternatively, the first electrode 22 may be formed from an opaque electrode metal around a window region for inputting and outputting light.

In the optoelectronic device portion 20 of the silicon optoelectronic device 10 according to the first embodiment of this invention configured above, if the substrate 11 is doped with n-type, the doped region 25, the second semiconductor material region 23, and the first semiconductor material region 21 are doped with p-type, p-type, and n-type, respectively. In this case, the first and second electrodes 22 and 27 serve as anode and cathode, respectively.

Figure 4:
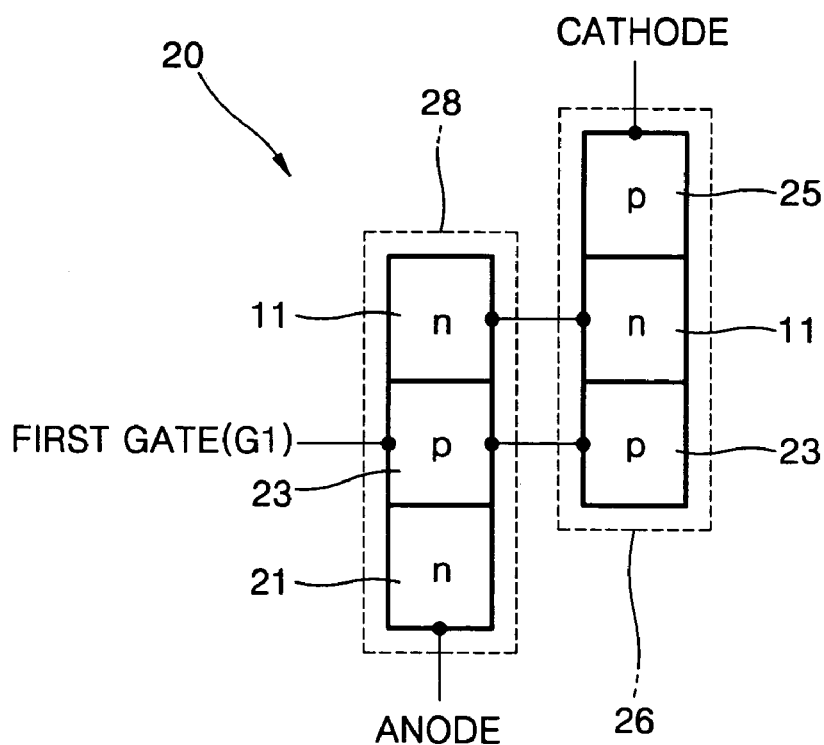
FIG. 4 illustrates the equivalent structure of the optoelectronic device portion shown in FIG. 2.
Figure 5:
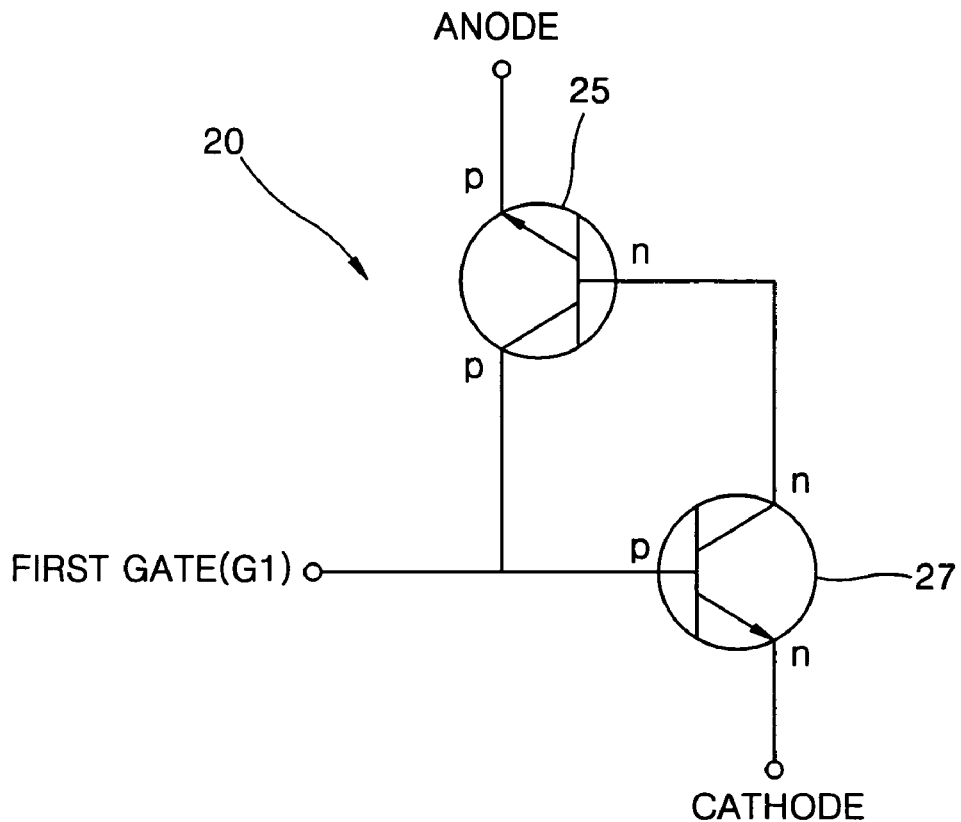
FIG. 5 illustrates an equivalent circuit for the optoelectronic device portion shown in FIG. 2.

When the substrate 11, the doped region 25, and the first and second semiconductor material regions 21 and 23 have the conductivity types as shown in FIG. 2, it is shown in FIGS. 4 and 5 that the doped region 25, the substrate 11, and the second semiconductor material region 23 form a pnp transistor structure 25 while the substrate 11, the second semiconductor material region 23, and the first semiconductor material region 21 form an npn transistor structure 27. FIGS. 4 and 5 show an equivalent structure and an equivalent circuit for the silicon optoelectronic device according to the first embodiment of this invention of FIG. 2, respectively.

As shown in the equivalent structure and an equivalent circuit of FIGS. 4 and 5, the optoelectronic device portion 20 including the doped region 25, the substrate 11, and the first and second semiconductor material regions 21 and 23 has a built-in two-step transistor.

On the other hand, if the substrate 11 is doped with p-type, the doped region 25 and the first and second semiconductor material regions 21 and 23 are doped with the opposite conductivity types to those presented above, accordingly. In this case, the doped region 25, the substrate 11, and the second semiconductor material region 23 form an npn transistor structure while the substrate 11, the second semiconductor material region 23, and the first semiconductor material region 21 form a pnp transistor structure. The first and second electrodes 22 and 27 serves as cathode and anode, respectively, and the first gate electrode 29 acts as a first gate G1.

Figure 6:
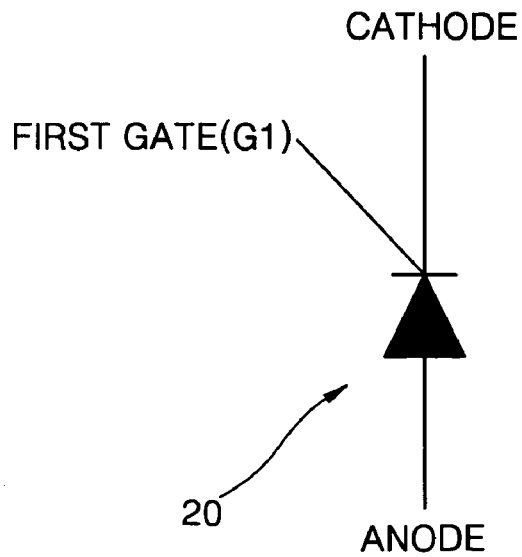
FIG. 6 shows an equivalent symbol for the optoelectronic device portion having a built-in two-step transistor shown in FIG. 2.

The optoelectronic device portion 20 incorporating the two-step transistor configured above can amplify microcurrent applied through the first gate G1 while cutting off the flow of reverse current, adjust the amount of light to be emitted at the p-n junction 24 according to the amount of current applied through the first gate G1, and switch on or off the light emission. In addition, as shown in FIG. 6, the optoelectronic device portion 20 is constructed to further include a diode for amplifying current. FIG. 6 shows an equivalent representation for the optoelectronic device portion 20 having the two-step transistor configured above.

The switching portion 30 allows power to be selectively applied to the optoelectronic device portion 20 so that emission and absorption of light selectively occurs. The switching portion 30 allows power to be applied to the optoelectronic device portion 20 when light emission is needed and interrupts power to avoid being applied to the optoelectronic device portion 20 when light absorption is needed.

FIG. 2 shows an example in which the silicon optoelectronic device 10 according to the first embodiment of this invention includes the optoelectronic device portion 20 having a two-step transistor and the switching portion 30 having a metal-oxide-semiconductor field effect transistor (MOSFET) structure. Here, MOSFET is a type of field effect transistor in which the gate is insulated from a semiconductor layer forming a current path by a thin silicon oxide ($SiO_2$) layer.

For example, in the switching portion 30 of a MOSFET structure, a pair of p+-type semiconductor material portions 31 and 33 are separated from each other and embedded into the n-type substrate 11, and a thin silicon oxide layer 15 is formed over the substrate 11. To achieve desired electrical insulation, as shown in FIG. 2, the silicon oxide layer 15 may be formed over the entire surface of the substrate 11 except the regions on the substrate 11 for electrical contact and emission and detection of light.

The third and fourth electrodes 37 and 39 are formed on the p+-type semiconductor material portions 31 and 33, respectively. The fourth electrode 39 may be formed to electrically contact the first electrode 22 of the optoelectronic device portion 20 so is is electrically connected to the doped region 25. The third and fourth electrodes 37 and 39 serve as the source S and drain D, respectively. The second gate electrode 35 is formed on the silicon oxide layer 15 between the third and fourth electrodes 37 and 39 to control the opening and closing of the current path between the source S and drain D according to the presence of power to be applied to a second gate G2.

The switching portion 30 of the MOSFET structure described above controls the opening and shutting of the current path between the source S and drain D according to the presence of voltage applied to the second gate G2 so that emission and detection of light can selectively occur in the optoelectronic device portion 20.

Figure 7:
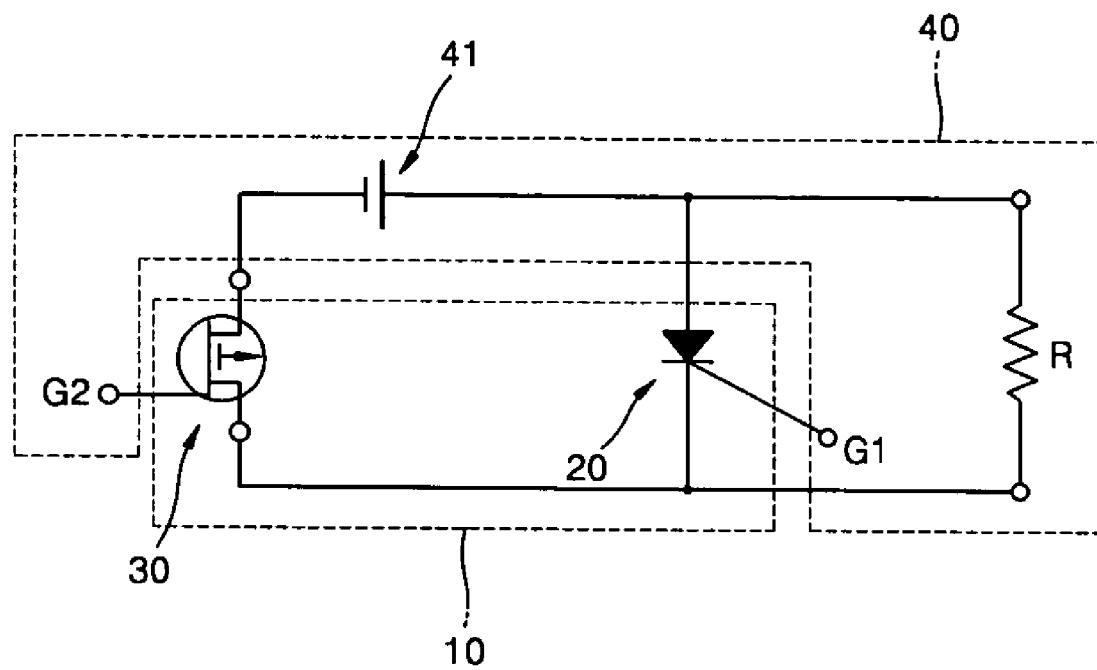
FIG. 7 shows an equivalent symbol for the silicon optoelectronic device of FIG. 2 and an external driving circuit for driving the silicon optoelectronic device.

FIG. 7 shows an equivalent representation for the silicon optoelectronic device 10 according to the first embodiment of this invention of FIG. 2 and the external driving circuit 40 for driving the silicon optoelectronic device 10.

As shown in FIG. 7, the silicon optoelectronic device 10 is constructed to include a switch cutting off the flow of reverse current and a diode, thereby selectively applying power to the optoelectronic device portion 20.

When a reverse current is applied to the first and second electrodes 22 and 27, the reverse current does not flow in the silicon optoelectronic device 10 of FIG. 7 above.

Thus, a power source 41 of the external driving circuit 40 is installed so that when a signal is input to the second gate G2, forward voltage can be applied across the first and second electrodes 22 and 27.

The operation of the silicon optoelectronic device 10 according to the first embodiment presented above will now be described.

Figure 8:
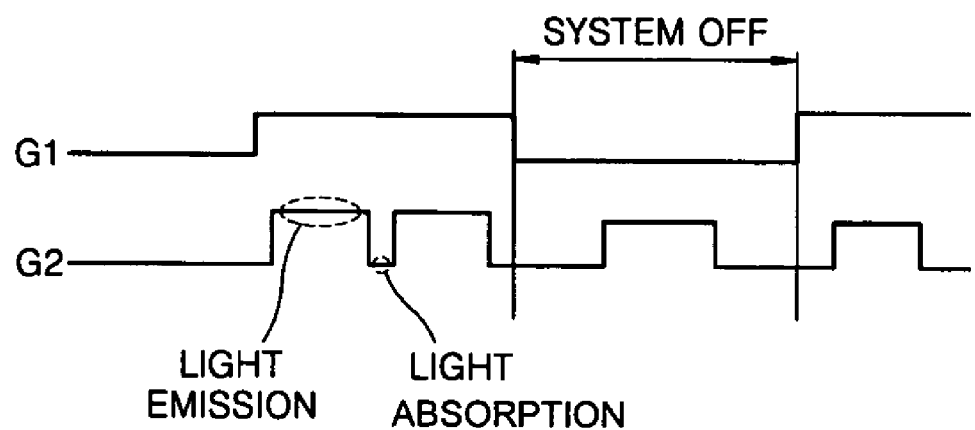
FIG. 8 is a timing chart illustrating the operation of the silicon optoelectronic device of FIG. 2.

Referring to FIG. 8, the silicon optoelectronic device 10 according to the first embodiment acts as a light-emitting element when a forward voltage is applied across the first and second electrodes 22 and 27 while a signal is input to the first gate G1. When no voltage is applied across the first and second electrodes 22 and 27, while a signal is input to the first gate of G1, the silicon optoelectronic device 10 acts as a light-detecting element.

More specifically, when the first gate G1 is not turned on, the silicon optoelectronic device 10 does not operate either as a light-emitting element or as a light-detecting element irrespective of the on/off status of the second gate G2. That is, if no signal is input to the first gate electrode 29, the silicon optoelectronic device 10 according to the first embodiment of this invention does not operate as an optoelectronic device regardless of whether a signal is being input to the second gate electrode 35.

The silicon optoelectronic device 10 according to the first embodiment of this invention operates as light-emitting or light-detecting element when the first gate G1 is turned on.

When the first and second gates G1 and G2 are turned on, a current path is formed between the third and fourth electrodes 37 and 39 of the switching portion 30. Then, a power current flows through the switching portion 30 into the optoelectronic device portion 20, and the silicon optoelectronic device 10 emits light.

When the first and second gates G1 and G2 are turned on and off, respectively, since the current path is not formed between the third and fourth electrodes 37 and 39 of the switching portion 30, a power current cut-off occurs and the silicon optoelectronic device 10 is put in state of capable of detecting light. Thus, under this state, when external light is incident on the doped region 25, a current proportional to the amount of incident light is generated, amplified, and output by creation of electron-hole pair caused by absorption of light at the p-n junction 24.

Since the load resistor R is connected between the first and second electrodes 22 and 27, when operating as a light detector, the silicon optoelectronic device 10 outputs a signal Vout.

Meanwhile, when a current is applied to the first gate electrode 29, voltage between the first and second electrodes 22 and 27, that is, anode and cathode, increases. The voltage between anode and cathode, which when a specific current is applied to the first gate electrode 29 when significant current flows suddenly through the silicon optoelectronic device 10 according to the first embodiment of this invention exits, is known as a breakover voltage.

If current is applied to the first gate electrode 29 with the voltage between anode and cathode exceeding the breakover voltage, then the cathode and anode conduct to supply a current needed for the silicon optoelectronic device 10 according to the first embodiment of this invention to perform light emission. Thus, application of a very small current to the first gate electrode 29 allows the silicon optoelectronic device 10 incorporating a transistor of two or more steps to occur due to annihilation of an electron-hole pair caused by quantum confinement effect at the p-n junction 24 to emit light.

Since the silicon optoelectronic device 10 according to the first embodiment of this invention does not operate when the first gate G1 current, i.e., current applied through the first gate electrode 29, is cut off, the first gate G1 current can be cut off in order to discontinue emission and detection of light in the silicon optoelectronic device 10 according.

That is, if the first gate G1 current is cut off with light emission being turned on, then the light emission is turned off. Thus, the light emission can be turned on or off by turning on or off the first gate G1 while the second gate G2 is turned on. Furthermore, if the first gate G1 current is cut off with light detection being on, i.e., with the first and second gates G1 and G2 being turned on and off, respectively, then the light detection is switched off.

When the first gate G1 signal is turned off, as shown in FIG. 8, then the silicon optoelectronic device 10 according to the first embodiment is in an off state in which neither emission nor detection of light occurs even though a second gate G2 signal, i.e., a signal is applied through the second gate electrode 35, is applied.

Furthermore, the silicon optoelectronic device 10 according to the first embodiment emits light if the second gate G2 signal is input with the first gate G1 current being applied, and detects light if the second gate G2 signal is not input.

Therefore, by adding a square wave control pulse to the first gate G1 current as well as applying power switching control pulse to the second gate G2 as needed, switching between emission and detection of light, and the duration of emission or detection of light in the silicon optoelectronic device 10 may be controlled.

In this case, since the silicon optoelectronic device 10 according to the first embodiment has a two-step transistor that can amplify electric current, the silicon optoelectronic device 10 emits light due to quantum confinement effect at the p-n junction 24 with small first gate G1 current while amplifying and outputting a small-amplitude detected signal by amplification of the two-step transistor.

In addition, by controlling the first and second gate G1 and G2 signals, the silicon optoelectronic device 10 according to this invention can adjust the duration of emission and detection of light. The first gate G1 current acts as a trigger signal for a switch that turns the system of the silicon optoelectronic device 10 on or off.

Here, when current is applied to the first gate electrode 29, the current flows into the npn transistor structure, which causes a base current of the pnp transistor to flow through the p-n junction 24 where emission and absorption of light occurs.

Furthermore, since light is emitted when the first and second gates G1 and G2 are turned on, but ceases when either the first or second gate G1 or G2 are turned off, the silicon optoelectronic device 10 according to the first embodiment can provide a duration of light emission. Furthermore, when the first gate G1 is turned on and the second gate G2 is switched from the off state to the on state to allow for switching from light absorption to light emission or when the first gate G1 is turned off, light detection can cease, thus the silicon optoelectronic device 10 can provide a desired duration of light detection.

By adjusting a signal being applied to the first and second gate electrodes 29 and 35 using a square wave pulse, emission and detection of light as well as switching between emission and detection of light can be controlled. Furthermore, by adjusting the period of a square wave pulse, desired durations of light emission and detection may be realized.

Figure 9:
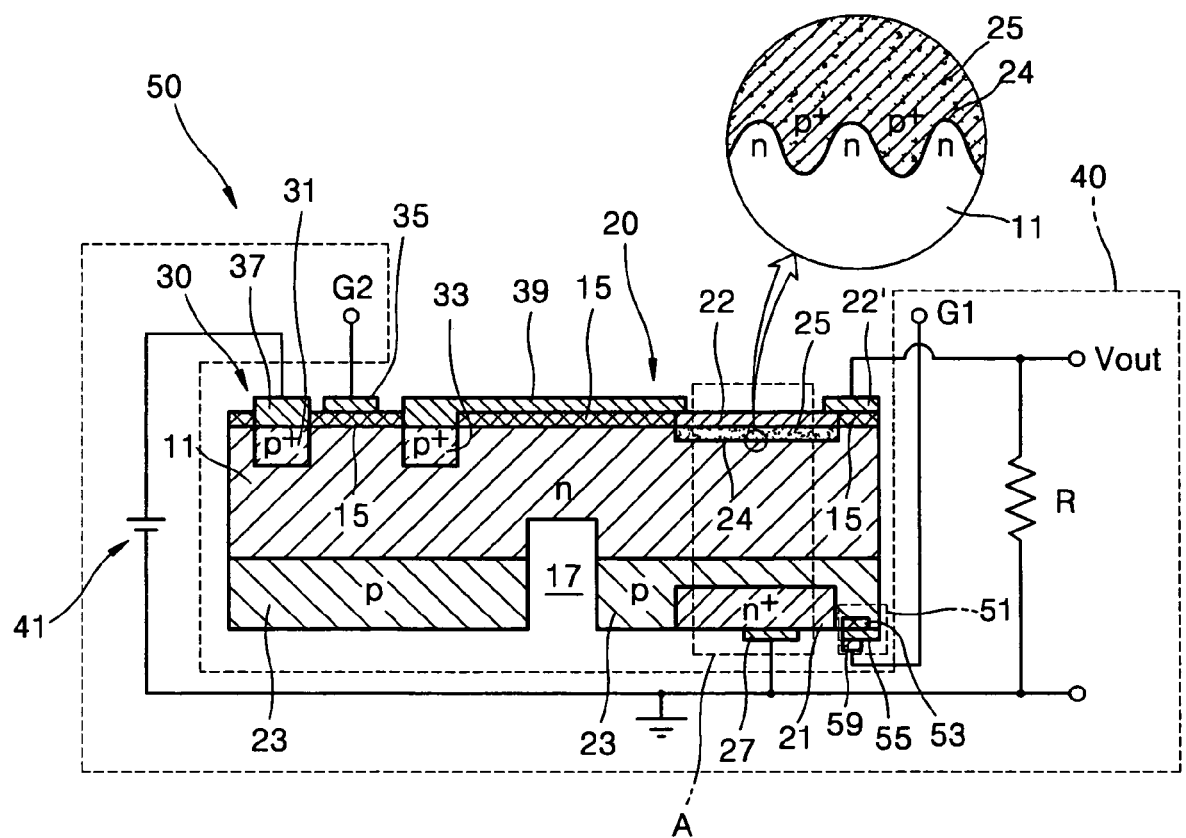
FIG. 9 is a schematic illustration of a silicon optoelectronic device according to a second embodiment of the present invention and its external driving circuit.

FIG. 9 schematically shows a silicon optoelectronic device 50, according to a second embodiment, having a first gate electrode structure 51 of a thick film resistor type. Here, elements having the same or similar functions as those in FIG. 2 are denoted by the same reference numerals, and the detailed description thereof will be omitted.

Referring to FIG. 9, the first gate electrode structure 51 of a thick film resistor type includes: an insulating film 53 formed on a portion of the second semiconductor material region 23, such as a portion of a region where the first gate electrode 29 in the first embodiment formed; a resistor material layer 55 formed on the insulating film 53 and the second semiconductor region 23; and a first gate electrode 59 formed on the resistor material layer 55 to electrically connect with the second semiconductor material region 23 on a narrow region by the insulating film 53, with the resistor material layer 55 provided between the first gate electrode 59 and the second semiconductor material region 23. The first gate electrode 59 has substantially the same function as the first gate electrode 29 in the first embodiment of this invention.

If the length, width, thickness, and resistivity of the resistor material layer 55 are respectively l, w, t, and ρs, the resistance RL of the resistor material layer 55 is RL=(lρs)/(wt). Thus, by selecting the length, width, and thickness of the resistor material layer 55 and appropriate material for the resistor material layer 55, as resistivity varies from material to material, the resistance required by the resistor material layer 55 can be obtained.

Typically, an external resistor is inserted into a circuit for driving an optoelectronic device to prevent malfunctioning of the optoelectronic device due to high currents. The first gate electrode structure 51 of a thick film resistor type in which the resistor has been buried eliminates the need to insert the external resistor.

While the embodiments shown and described so far have been with reference to the silicon optoelectronic device having a built-in two-step transistor, this invention is not limited to this structure. That is, the silicon optoelectronic device according to this invention may have a built-in transistor of two or more steps built-in. Alternatively, as described below regarding a third embodiment of this invention, a silicon optoelectronic device may have a built-in one-step transistor.

Figure 10:
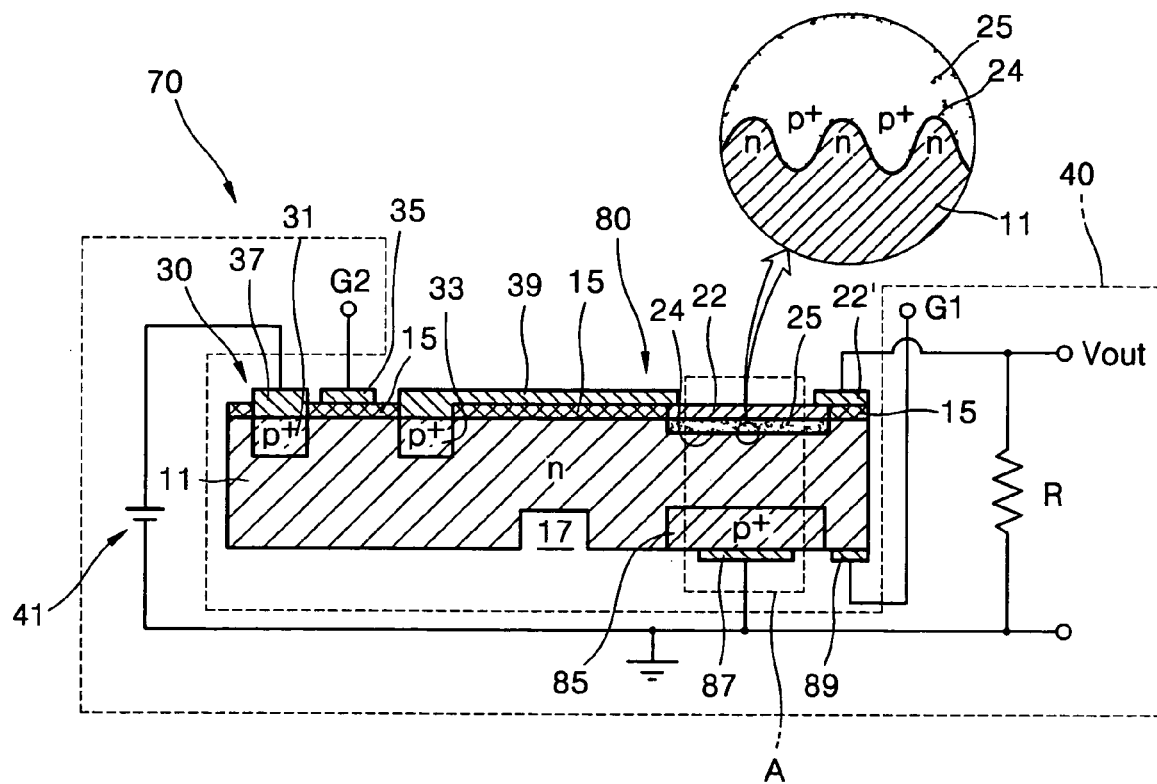
FIG. 10 is a schematic illustration of a silicon optoelectronic device according to a third embodiment of the present invention and its external driving circuit.

FIG. 10 schematically shows a silicon optoelectronic device 70 according to a third embodiment of this invention.

Referring to FIG. 10, the silicon optoelectronic device 70 according to the third embodiment of this invention has an optoelectronic device portion 80 constructed to incorporate a one-step transistor. Here, elements having substantially the same functions as those in FIG. 2 are denoted by the same reference numerals, and a detailed description thereof will be omitted.

In the third embodiment of this invention, the optoelectronic device portion 80 includes: the ultra-shallowly doped region 25 of the opposite type to the substrate 11 formed on a portion of the substrate 11, where light emission occurs due to annihilation of electron-hole pairs caused by quantum confinement effect at the p-n junction 24; a semiconductor material region 85 of the opposite type to the substrate 11 formed on the rear surface of the substrate 11, the first electrode 22 electrically connected to the doped region 25, a second electrode 87 electrically connected to the semiconductor material region 85, and a first gate electrode 89 electrically connected to the substrate 11. Here, the second electrode 87 and the first gate electrode 89 correspond to the second electrode 27 and the first gate electrode 29 in FIG. 2, respectively.

Figure 11:
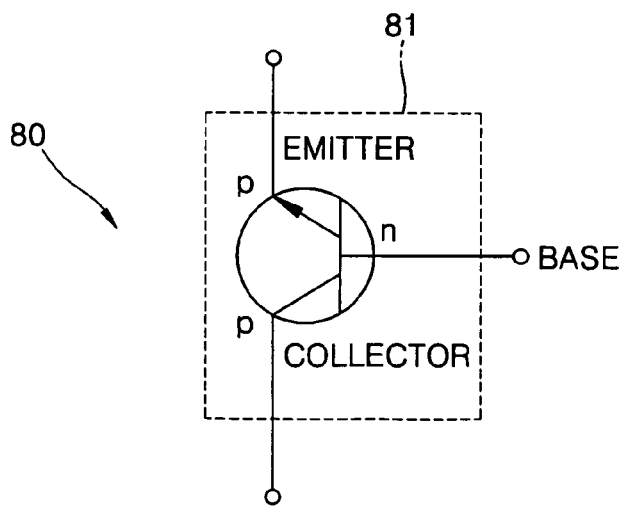
FIG. 11 shows an equivalent circuit for the optoelectronic device portion shown in FIG. 10.

The optoelectronic device portion 80, as shown in the equivalent circuit thereof in FIG. 11, has a built-in one-step transistor.

The semiconductor material region 85 may be formed on a portion of the rear surface of the substrate 11 by injecting a dopant deeper than the dopant for the doped region 25. For example, the semiconductor material region 85 may be formed on the rear surface of the substrate 11 by injecting a dopant for doping an opposite type of the substrate 11 using typical diffusion by which the dopant is diffused deeper into the semiconductor material region 85 than for the doped region 25. The semiconductor material region 85 may also be formed by injecting a dopant using an implantation method.

The semiconductor material region 85 may be formed by etching a portion of the rear surface of the substrate 11 and depositing a semiconductor material of the opposite conductivity type to the substrate 11, such as p-type semiconductor material, into the etched portion.

In the silicon optoelectronic device 70 according to the third embodiment, if the substrate 11 is doped with n-type material, then the doped region 25 and the semiconductor material region 85 are doped with p-types, thus forming a pnp transistor structure 81 as shown in FIG. 11.

When the doped region 25, the substrate 11, and the semiconductor material region 85 forms the pnp transistor structure 81, the optoelectronic device 70 according to the third embodiment of this invention preferably uses the doped region 25, the semiconductor material region 85, and the substrate 11 as the collector, emitter, and base, respectively, operating as base-to-ground or emitter-to-ground circuit. In this case, the n-type layer in the middle of the structure 81 corresponding to the substrate 11 may be thin.

When the doped region 25, the semiconductor material region 85, and the substrate 11 act as the collector, emitter, and base, respectively, as described above, the first electrode 22, the second electrode 87, and the first gate electrode 89 electrically connected to the doped region 25, the semiconductor material region 85, and the substrate 11 serve as collector, emitter, and base electrodes, respectively.

On the other hand, if the substrate 11 is doped with p-type material and the doped region 25 and the semiconductor material region 85 are doped with the opposite conductivity types to those presented above, accordingly, the doped region 25, the substrate 11, and the semiconductor material region 85 form an npn transistor structure.

The one-step transistor structure 81 in the silicon optoelectronic device 70 according to the third embodiment operates as a pulse switching circuit when a forward voltage is applied between the emitter and base and between the collector and base.

The one-step transistor structure 81 also operates as a pulse switching circuit when a backward voltage is applied between the emitter and base and between the collector and base.

The silicon optoelectronic device 70 having a built-in one-step transistor operates as light-emitting or light-receiving element on the following principles.

Applying a forward or backward voltage between the emitter and base and between the collector and base of the silicon optoelectronic device 70 allows emission or detection of light due to quantum confinement effect at the p-n junction 24 while controlling the on/off status of emission or detection of light.

Furthermore, the one-step transistor structure 81 in the silicon optoelectronic device 70 provides a single step of amplification when forward and backward voltages are applied between the emitter and base and between the collector and base, respectively.

Thus, if forward and backward voltages are applied between the emitter and base and between the collector and base, respectively, when the first and second gates G1 and G2 are turned on, the silicon optoelectronic device 70 allows light emission to occur at the p-n junction 24 even when applying a small-amplitude is applied to the first gate G1 current signal, while amplifying and outputting a signal detected upon photodetection when the first gate G1 is turned off, the second gate G2 is turned off.

When the doped region 25, the substrate 11, and the semiconductor material portion 85 form a pnp transistor structure, the silicon optoelectronic device 70 also provides a single step of amplification and pulse switching functions.

As described above, a transistor structure of one or more steps built-into the silicon optoelectronic device functions as an active element built-in capable of selecting at least one of functions of amplification, switching, and state (in which current is flowing or cease to flow) keeping functions, thereby driving light-emitting and light-detecting elements.

Figure 12:
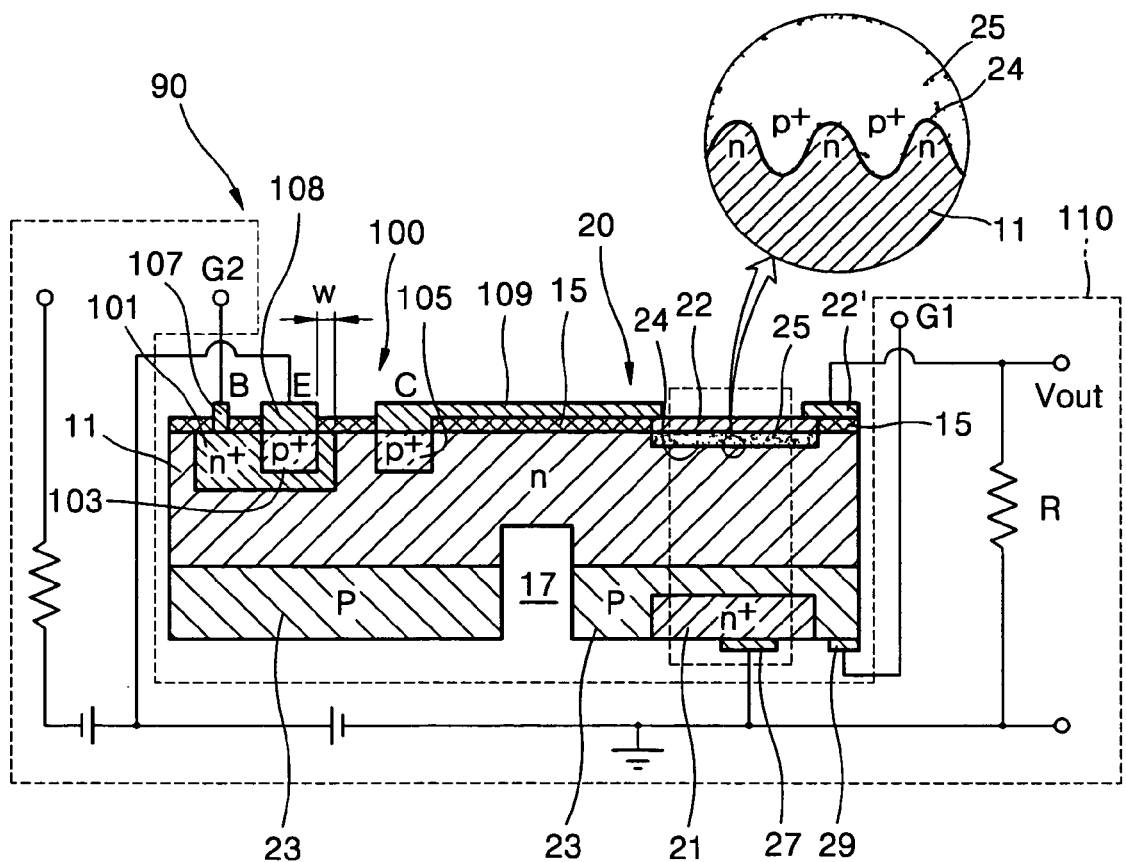
FIG. 12 is a schematic illustration of a silicon optoelectronic device according to a fourth embodiment of the present invention and its external driving circuit.
Figure 13:
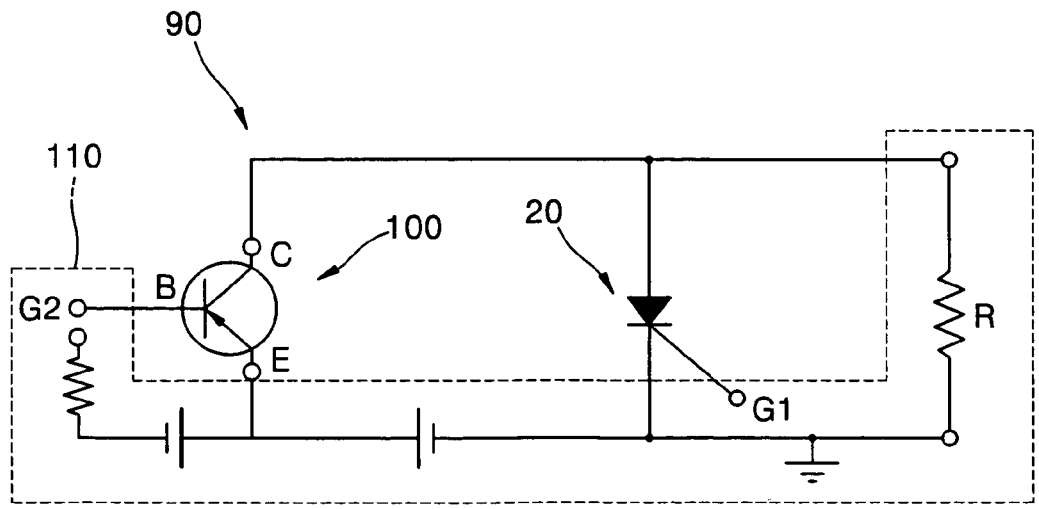
FIG. 13 is an equivalent circuit diagram of the silicon optoelectronic device of FIG. 12.

FIG. 12 shows a silicon optoelectronic device 90 according to a fourth embodiment and its external driving circuit 110, and FIG. 13 shows an equivalent circuit therefore. Referring to FIGS. 12 and 13, the silicon optoelectronic device 90 according to the fourth embodiment includes a switching portion 100 having a bipolar junction transistor structure. Here, elements having substantially the same functions as those in FIG. 2 are denoted by the same reference numerals, and a detailed description thereof will be omitted.

Here, a bipolar junction transistor is designed so that a base current is used to control the flow of carriers from the emitter 103 to the collector 105. There are three types of bipolar junction transistors classified in accordance with the method used to form the pn junction: alloy transistor, grown junction transistor, and diffuse transistor.

FIG. 12 shows an example in which the switching portion 100 is constructed to have a planar structure by a diffusion process. When applying the diffusion approach, the switching portion 100 can be manufactured to have a pnp structure by forming an n+-type base 101 by doping on the same surface as that where the doped region 25 is formed, forming the p+-type emitter 103 on the base 101 by doping, and then forming the p+-type collector 105 on the substrate 11 by doping so that the collector 105 can be separated from the base 101. Here, the switching portion 100 may be manufactured with an npn structure.

In this case, the emitter 103 may be formed to have an impurity concentration that is sufficiently smaller than that of the base 101, and that the width of base 101 is sufficiently small, i.e., a gap w is between the boundaries of the base 101 and the emitter 103 is narrow enough, that most carriers reach the collector 105.

If the switching portion 100 is a bipolar junction transistor of a pnp structure, as shown in FIG. 12, holes act as carriers. In contrast, if the switching portion 100 is a bipolar junction transistor of an npn structure, electrons act as carriers.

Meanwhile, base, emitter, and collector electrodes 107, 108, and 109 are formed on the base 101, the emitter 103, and the collector 105, respectively. The collector electrode 109 is formed to contact the first electrode 22 of the optoelectronic device portion 20, and so is electrically connected to the doped region 25.

The base electrode 107 is used as the second gate G2. In order for light emission to occur in the silicon optoelectronic device 90 according to the fourth embodiment of this invention, a voltage signal is input to the second gate G2.

That is, the switching portion 100 shown in FIG. 12 is designed as a voltage driven pnp bipolar junction transistor to apply a trigger signal for switching light emission power input through the second gate G2, i.e., the base electrode 107.

The silicon optoelectronic device 90 according to the fourth embodiment of this invention described above including the switching portion 100 of a bipolar junction transistor structure allows selective emission and detection of light.

The principles of controlling the emission and detection of light, switching between the emission and detection of light, and duration of the emission and detection in the silicon optoelectronic device 90 having the bipolar junction transistor structure configured above are similar to those in the silicon optoelectronic device 10 according to the first embodiment of this invention described with reference to FIG. 2.

That is, when the first gate G1 is turned off, the silicon optoelectronic device 90 does not perform emission or detection of light regardless of the on/off status of the second gate G2. When the first and second gates G1 and G2 are turned on, carriers move from the emitter 103 into the collector 105 and then a power current flows toward the optoelectronic device portion 20, causing light emission at the p-n juction 24 of the doped region 25. Thus, by turning the first gate G1 on or off while keeping the second gate G2 in the on state, light emission can be turned on or off. When the second gate G2 is turned off with the first gate G1 being turned on, the silicon optoelectronic device performs light detection.

Since the principles of controlling the emission and detection of light, switching between the emission and detection of light, and duration thereof in the silicon optoelectronic device 90 configured above are similar to those in the first embodiment of this invention described with reference to FIG. 2, a detailed description thereof will be omitted.

While FIG. 12 has shown an example of the silicon optoelectronic device 90 according to the fourth embodiment of this invention including the optoelectronic device portion 20 into which a two-step amplification transistor has been built, the structure of optoelectronic device portion 20 in the silicon optoelectronic device 90 is not limited to this structure. That is, it is possible to have a switching portion of a bipolar junction transistor structure and an optoelectronic device portion incorporating an amplification transistor of two or more steps. Also, the switching portion has a bipolar junction transistor structure and, as described in the second embodiment of this invention, the optoelectronic device portion may be formed to have a one-step amplification transistor built-in. Furthermore, it is possible to include the first gate electrode structure 51 of a thick film type as described in the third embodiment of this invention instead of the first gate electrode 29.

Since the switching portion 100 shown in FIG. 12 is only an example of a detailed structure for a bipolar junction transistor, various changes in details of the switching portion 100 and the external driving circuit 110 for driving the silicon optoelectronic device 90 having the switching portion 100 may be made.

The silicon optoelectronic device according to the embodiments of this invention configured above includes an optoelectronic device portion into which a transistor of one or more steps has been built as well as a switching portion for selectively controlling the emission and detection of light. Thus, the silicon optoelectronic device according to this invention provides internal current amplification thus allowing light emission to occur with a small electric current and amplifying and outputting a light detection signal. Furthermore, the silicon optoelectronic device according to this invention eliminates parasitic effects of reactance and capacitance in the external power lines that may occur in a conventional structure externally providing amplifying circuit and a switching circuit, thereby allowing for high speed switching.

The silicon optoelectronic device according to this invention as described above can selectively operate as a light-emitting and light-detecting element. Therefore, use of the silicon optoelectronic device of this invention makes it possible to realize an image input/output device capable of inputting and outputting images through the same pixel.

Figure 14:
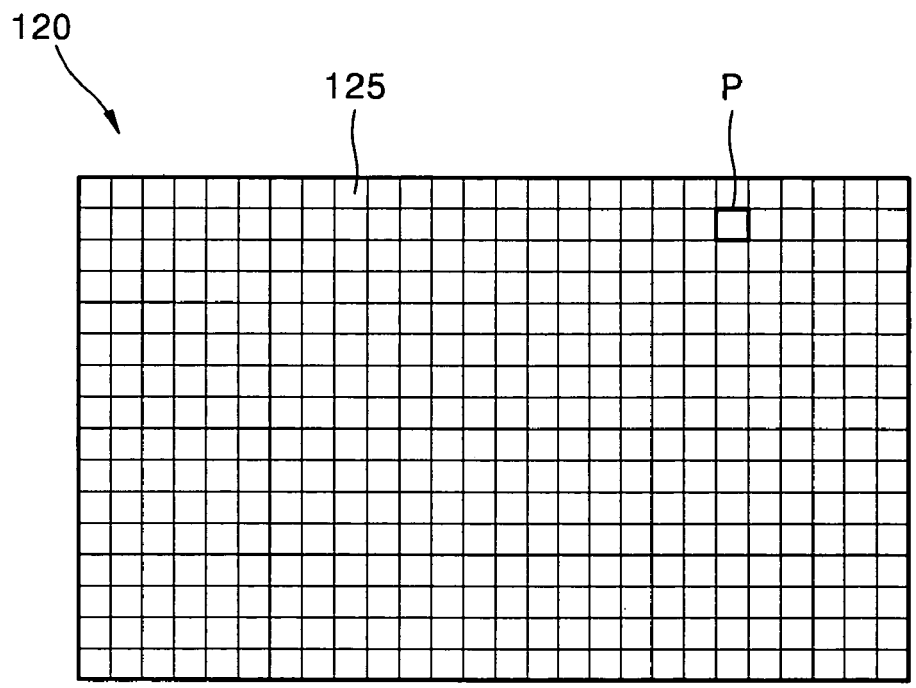
FIG. 14 schematically shows an image input/output device according to a first embodiment of this invention.

FIG. 14 schematically shows an image input/output device using the silicon optoelectronic device of this invention according to a first embodiment of this invention. Referring to FIG. 14, a first embodiment of the image input/output device includes a silicon optoelectronic device panel 120 composed of a plurality of silicon optoelectronic devices 125 arranged in two-dimensional arrays on an n- or p-type silicon-based substrate, each silicon optoelectronic device allowing for both emission and detection of light and switching between both operations. Any of the silicon optoelectronic devices according to the previous embodiments of this invention may be used for the silicon optoelectronic device 125.

The silicon optoelectronic device 125 allows for both emission and detection of light as well as easy switching between both operations, thus making it possible to perform input and output of image through the same silicon optoelectronic device 125. Thus, the silicon optoelectronic device panel 120 allows for image input and output through the same pixel.

Furthermore, the silicon optoelectronic device 125 can control the duration of light emission and detect, drive light emission with a small electric current, and amplify and output a light detection signal, thus making it possible to control the input and output of image without external amplifying and switching circuits as desired and realizing a low power image input/power device.

Since the silicon optoelectronic device 125 can be formed in a micro-array using semiconductor material, the silicon optoelectronic device panel 120 may be manufactured on the single n- or p-type silicon substrate 11 using a semiconductor fabrication process.

An electrode structure in the silicon optoelectronic device panel 120 including of two-dimensional arrays of optoelectronic devices 125 is patterned into the substrate 11 in order to enable the input and output of an image on a pixel-by-pixel basis.

In the image input/output device according to the present invention, the silicon optoelectronic device panel 120, as shown in FIG. 14, may be formed so that a single silicon optoelectronic device 125 corresponds to each pixel P. In this case, each silicon optoelectronic device 125 may be configured to emit or detect light of a single wavelength or white light.

When the silicon optoelectronic device 125 is configured to emit and detect light of a single wavelength or white light, the image input/output device according to the present invention makes it possible to display a monochromatic image and generate an electrical monochromatic image signal by photographing an object.

Figure 15:
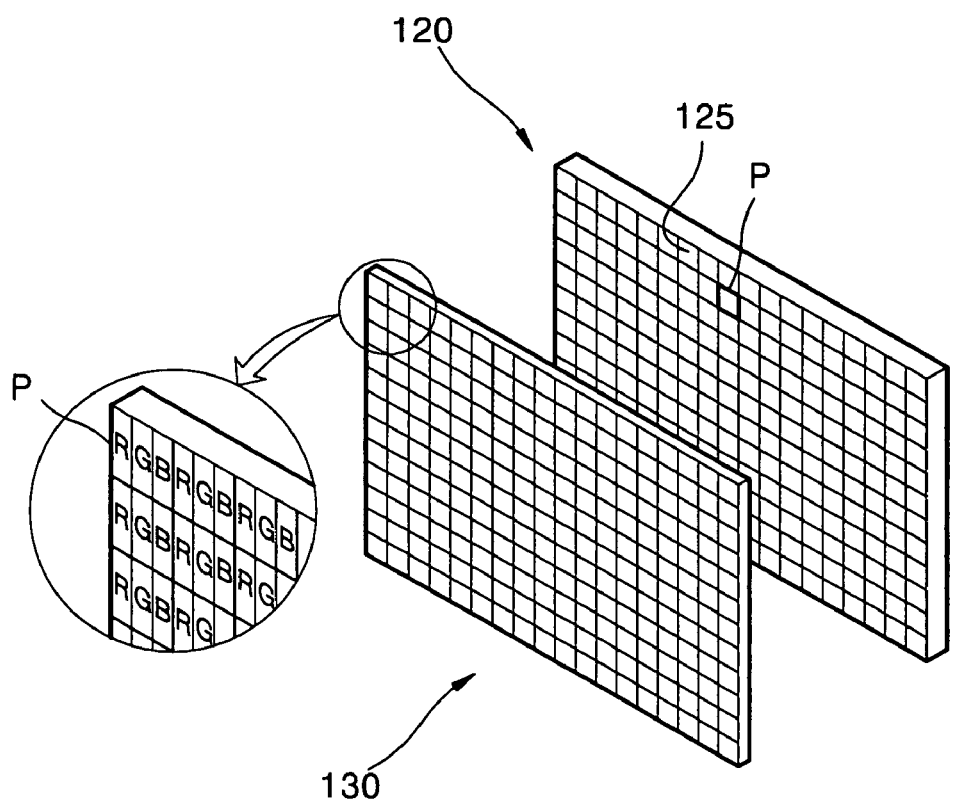
FIG. 15 is an exploded perspective schematic illustration showing an image input/output device according to a second embodiment of this invention.

Meanwhile, as shown in FIG. 15, a second embodiment of the image input/output device includes the silicon optoelectronic device panel 120, in which each silicon optoelectronic device 125 is configured to emit and detect white light, as well as a color filter 130 for displaying full-color image positioned on the front surface of the silicon optoelectronic device panel 120 (on light input and output side), is capable of displaying full-color image while generating electrical full-color image signal by photographing an object in full color.

Figure 16:
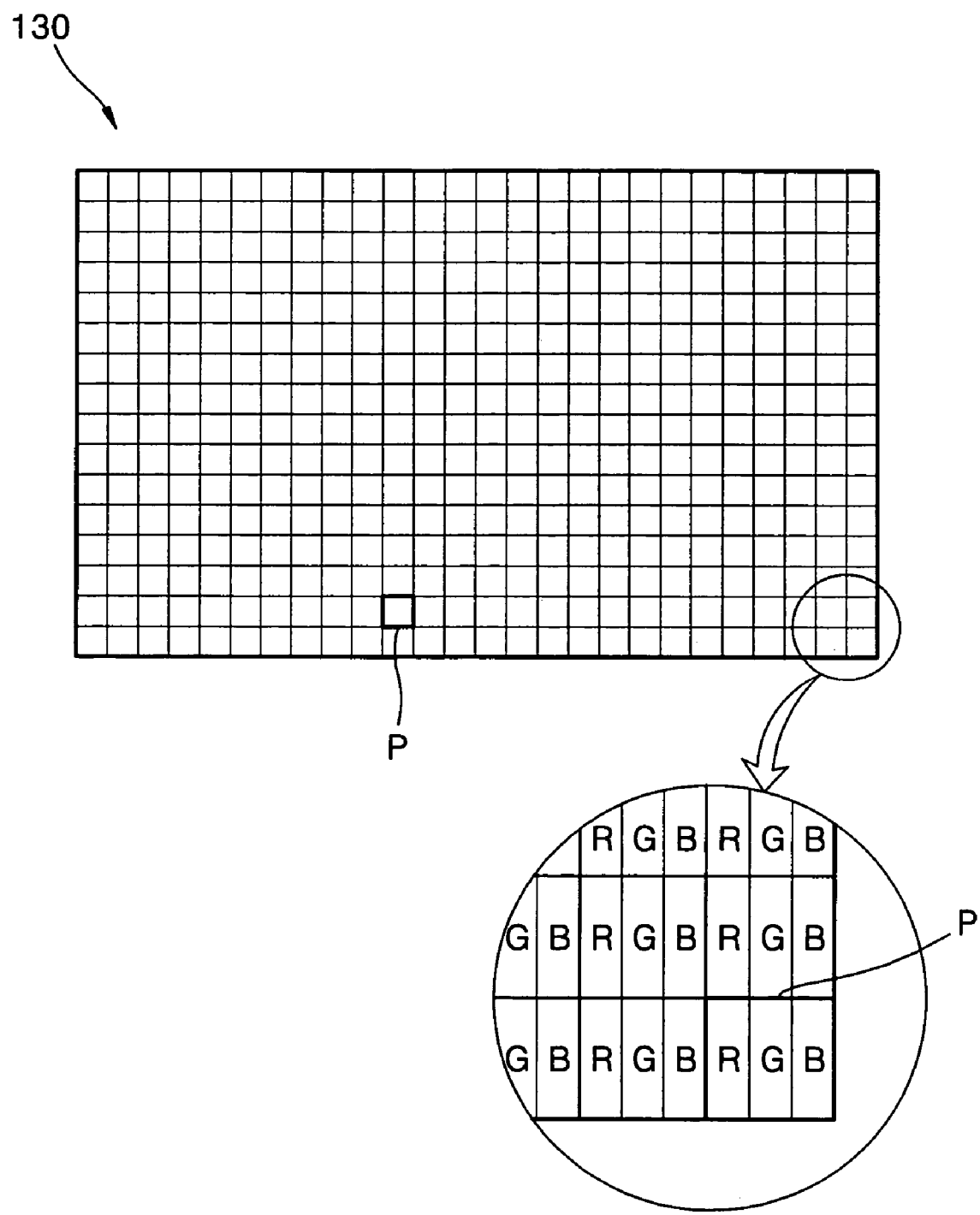
FIG. 16 is a plane schematic illustration of the structure of the color filter shown in FIG. 15.

In this case, the color filter 130, as shown in FIG. 16, may be configured so that all R, G, B color components correspond to each pixel P.

The R, G, B components of the color filter 130 are arranged in a way similar to the way in which silicon optoelectronic devices in a silicon optoelectronic device panel according to a third embodiment of image input/output device, which will be described later, are arranged two-dimensionally. Here, various changes may be made with respect to arrangement in the color filter 130 for representing R, G, and B colors.

In this way, the image input/output device including the color filter 130 provided on the front surface of the silicon optoelectronic device panel 120 allows a color image to be input and output. That is, this device makes it possible to convert the photographed image into an electrical color image signal and display a full color image according to the electrical color image signal.

Figure 17:
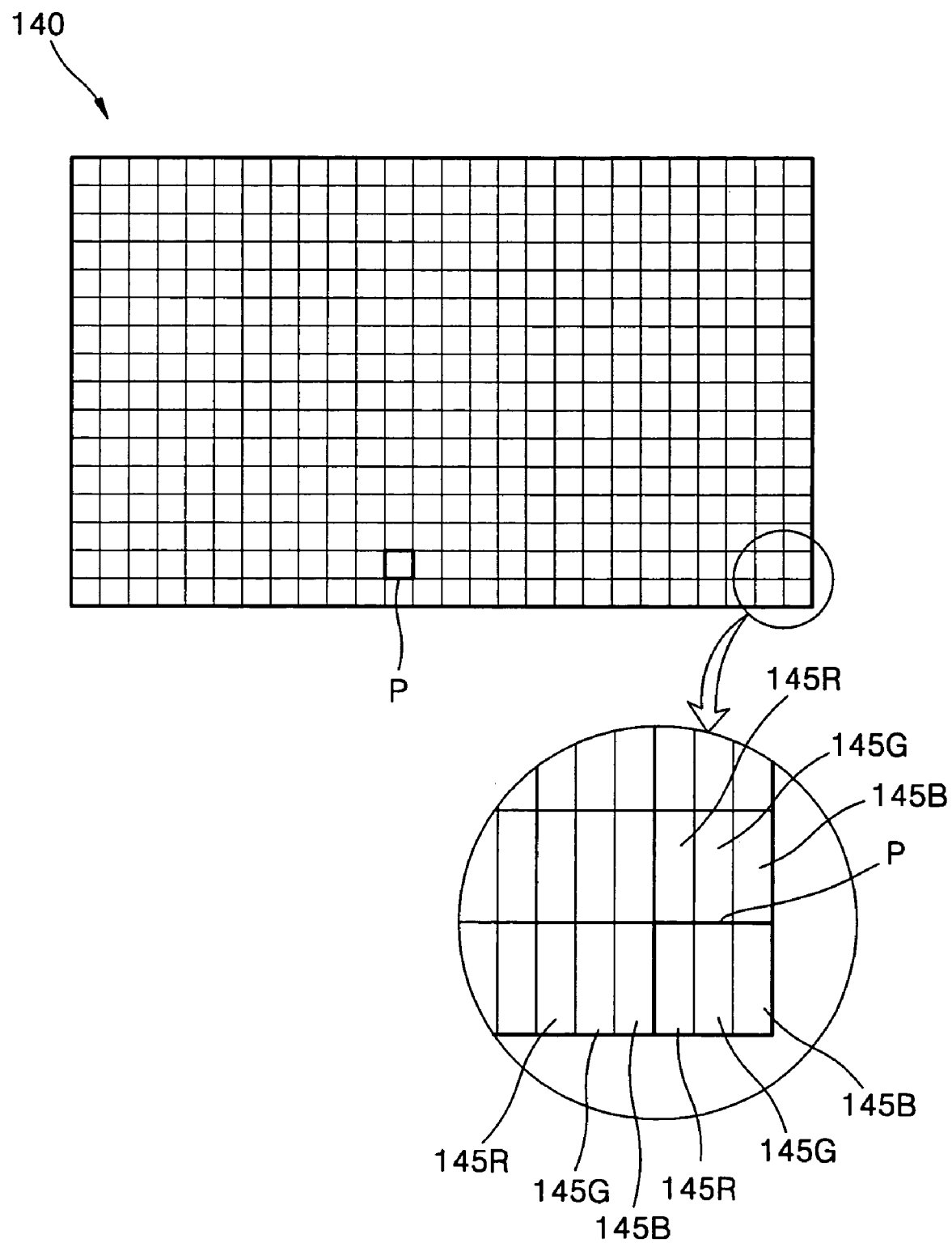
FIG. 17 is schematic illustration of an image input/output device according to a third embodiment of this invention.

FIG. 17 is a schematic illustration of a third embodiment of an image input/output image device. Referring to FIG. 17, a silicon optoelectronic device panel 140 is configured so that at least three silicon optoelectronic devices 145R, 145G, and 145B correspond to each pixel P. FIG. 17 shows an example in which the silicon optoelectronic device panel 140 is designed such that the three silicon optoelectronic devices 145R, 145G, and 145B correspond to each pixel P.

When the three silicon optoelectronic devices 145R, 145G, and 145B correspond to each pixel P, any of the silicon optoelectronic devices discussed above are designed to emit red light R, green light G, and blue light B, detect each respective color of light, and convert detected signals into electrical color image signals may be used.

In this way, when a silicon optoelectronic device panel is configured so that the three silicon optoelectronic devices 145*a*, 145*b*, and 145*c* for emitting and detecting specific color light such as red light R, green light G, and blue light B are provided for each pixel, the image input/output device according to this invention can represent full RGB color without a color filter. In this case, to enable emission and detection of different wavelengths different, the silicon optoelectronic devices 145*a*, 145*b*, and 145*c* are configured to have micro-cavities with different lengths.

Using the silicon optoelectronic device panel 140 according to the present invention shown in FIG. 17, it is possible to display color images without a separate color filter. The color filter 130 as shown in FIGS. 15 and 16 may be positioned on the front surface of the silicon optoelectronic device panel 140 in order to produce more distinct color image. Furthermore, various changes may be made with respect to color arrangement in the at least three silicon optoelectronic devices 145R, 145G, and 145B for emitting and detecting three wavelengths of light corresponding to each pixel and/or arrangement of the R, G. B components in the color filter 130.

As described above, since the image input/output device according to the present invention capable of inputting and outputting monochromic color image allows for selective image input and output on a pixel-by-pixel basis, this can be used as image input/output device for equipment requiring bi-directional visual communications such as computer monitors, televisions, and handheld terminals. Here, examples of the handheld terminals may include a wide variety of portable communication equipment such as mobile phones and personal digital assistants (PDAs). Since an image input/output device according to the present invention allows for image input and output in a single panel, the use of this device eliminates the need for a separate camera when performing visual communication.

Furthermore, an image input/output device according to the present invention, capable of inputting and outputting image in a single panel, makes it possible for an operator to take a photograph of himself/herself right in front of a monitor and transmit it, thus enhancing vividness in visual communication.

Although this invention has been described with reference to the image input/output device including a single silicon optoelectronic device including a plurality of silicon optoelectronic devices arranged in two-dimensional arrays, this invention is not limited to this. That is, the image input/output device according to the present invention may be configured in combinations of a plurality of silicon optoelectronic device panels to have a larger screen.

Figure 18:
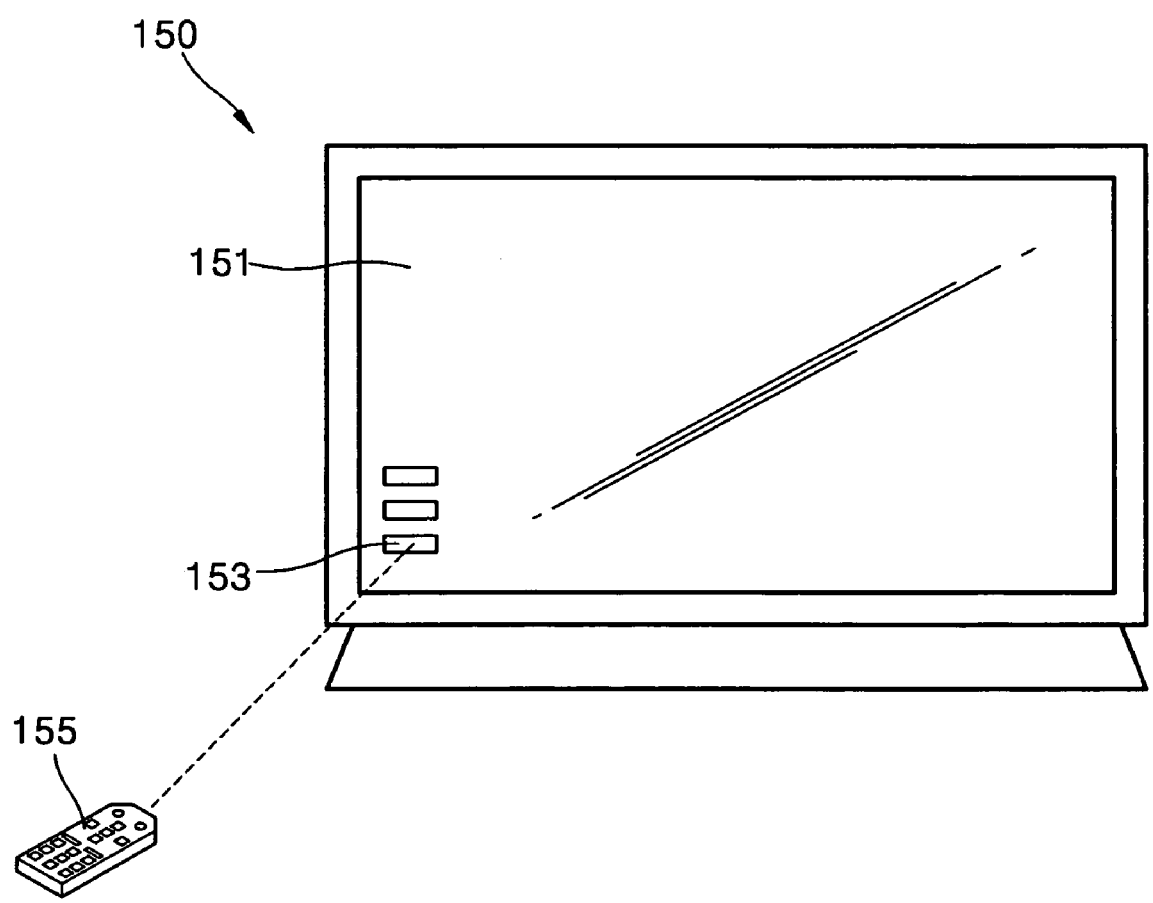
FIG. 18 shows an image input/output device used as a digital television according to an embodiment of the present invention.

FIG. 18 shows an image input/output device used as a digital television. As shown in FIG. 18, the image input/output device according to the present invention can be used in a digital television designed to input information into a screen 151 and select a menu with an optical wireless remote controller 155. The optical wireless remote controller 155 is designed to emit light only in a specific range like an optical pointer. When an optical signal is incident on a specific region within the screen 151 such as a predetermined menu 153 from the optical wireless remote controller 55, a silicon optoelectronic device serving as a light-receiving element positioned in the specific region receives the optical signal and performs its functions according to the received optical signal, for example, changing channels of the digital television 50 or working on the Internet.

In addition to the above, an image input/output device may be used in various applications for equipment requiring bi-directional information transmission.

The silicon optoelectronic device described above is manufactured by forming a switching portion of a MOSFET or bipolar junction transistor structure on a single-crystalline silicon wafer and then forming an optoelectronic device portion adjacent thereto by ultra shallowly diffusion or implantation process.

When forming a silicon optoelectronic device panel, interlayer wiring and power supply lines are connected to each pixel structure as in the process of forming word lines and bit lines in a typical memory fabrication process. The silicon optoelectronic device panel, as light-emitting and light-receiving IC that can be controlled on a pixel-by-pixel basis, can control easily the duration of emission and reception of light and perform both emission and reception in the same pixel.

The silicon optoelectronic device according to this invention described above is formed to have a built-in circuit for performing switching and/or amplification functions on a silicon-based substrate as well as an ultra-shallowly doped region, thereby allowing for both emission and detection of light.

Thus, the silicon optoelectronic device according to this invention described above can selectively perform emission and detection of light, easily control the duration of both operations, and perform high speed switching without using external amplifying and switching circuits.

Furthermore, the silicon optoelectronic device having a built-in circuit for switching and/or amplifying functions according to this invention configured above can be manufactured by a series of semiconductor fabrication process due to use of a silicon-based substrate.

Meanwhile, in the image input/output device according to this invention, the silicon optoelectronic device panel using the silicon optoelectronic device according to this invention is integrated light emitting and receiving element by unit cells, capable of controlling the duration of light emission and detection for each unit cell, and has a built-in amplifying circuit thus reducing the overall size. Thus, the image input/output device according to this invention can be used in applications that require integration with small products.

The image input/output device according to this invention can perform light emission and detection for each pixel thus making it possible to display an image on a single panel, generate an electrical image signal by photographing the desired object without being prohibited from viewing the image displayed, or to directly input optical information into a screen, thus allowing the bi-directional information transmission.

Thus, using an image input/output device according to the present invention for visual communication offers vivid communication by eliminating the need for a separate camera. Using this device for a digital TV allows a menu in a screen to directly be selected with an optical remote controller.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A silicon optoelectronic device comprising:
    an n- or p-type silicon-based substrate;
    an optoelectronic device portion including
        a doped region doped with a dopant of the opposite type to the substrate on a portion of the substrate, the doped region provided to emit and absorb light, and
        a plurality of semiconductor material regions formed on a rear surface of the substrate,
            wherein at least one portion of the plurality of semiconductor material regions and the doped region form a stack structure,
            the semiconductor material regions adjacent to the substrate have the opposite conductivity type to the substrate, and
            the neighbouring semiconductor material regions have the opposite conductive types to each, thereby providing a built-in transistor having at least two steps;
    a switching portion formed on one side of the optoelectronic device portion and shared with the substrate, the switching portion selectively controlling emission and detection of light in the optoelectronic device portion; and
    an electrode structure that performs at least one of supplying an electrical signal to the optoelectronic device portion and switching portion for controlling emission and detection of light, and outputting a light detection signal.

2. The silicon optoelectronic device as claimed in claim 1, wherein the electrode structure comprises:
    when a semiconductor material region positioned at the outermost side of the portion of the optoelectronic device portion having the stack structure is a first semiconductor material region, and a semiconductor material region adjacent to the inside of the first semiconductor material region is a second semiconductor material region, a first gate electrode electrically connected to the second semiconductor material region;
    a first electrode electrically connected to the doped region; and
    a second electrode electrically connected to the first semiconductor material region.

3. The silicon optoelectronic device as claimed in claim 2, wherein the first electrode is a transparent electrode formed on the doped region.

4. The silicon optoelectronic device as claimed in claim 2, wherein the electrode structure further comprises:
    an insulating film formed on a portion of the second semiconductor material region; and
    a high resistance material layer, on which the first gate electrode is formed, formed on the insulating film and the second semiconductor material region,
    wherein the first gate electrode electrically connects with the second semiconductor material region on a narrow region by the insulating film, with the high resistance material layer is between the first gate electrode and the second semiconductor material region.

5. The silicon optoelectronic device as claimed in claim 1, wherein the plurality of semiconductor material regions are deeper than the doped region.

6. The silicon optoelectronic device as claimed in claim 1, wherein the switching portion has a metal-oxide-semiconductor field effect transistor (MOSFET) structure,
    wherein the electrode structure further comprises a second gate electrode and third and fourth electrodes, all of which are provided on the switching portion, and
    wherein one of the third and fourth electrodes is electrically connected to the doped region.

7. The silicon optoelectronic device as claimed in claim 1, wherein a gap between the boundaries of the base and emitter on the side of the collector is narrow enough.

8. The silicon optoelectronic device as claimed in claim 2, wherein the plurality of semiconductor material regions are formed on the rear surface of the substrate by injecting a dopant deeper than the dopants for the doped region.

9. The silicon optoelectronic device as claimed in claim 3, wherein the plurality of semiconductor material regions are formed on the rear surface of the substrate by injecting a dopant deeper than the dopants for the doped region.

10. The silicon optoelectronic device as claimed in claim 4, wherein the plurality of semiconductor material regions are formed on the rear surface of the substrate by injecting a dopant deeper than the dopants for the doped region.

11. A silicon optoelectronic device comprising:
    an n- or p-type silicon-based substrate;
    an optoelectronic device portion including a doped region doped with a dopant of the opposite type to the substrate on a portion of the substrate, the doped region provided to emit and absorb light; and a semiconductor material region formed on a portion of a rear surface of the substrate, the semiconductor material region has the opposite conductivity type to the substrate and forms a stack structure with the doped region so that the optoelectronic device has a built-in one-step transistor;

a switching portion formed on one side of the optoelectronic device portion and on the substrate, the switching portion selectively controlling emission and detection of light in the optoelectronic device portion; and an electrode structure for providing at least one of supplying an electrical signal to the optoelectronic device portion and the switching portion for controlling emission and detection, and outputting a light detection signal.

12. The silicon optoelectronic device as claimed in claim 11, wherein the electrode structure comprises:
   a first gate electrode electrically connected to the substrate;
   a first electrode electrically connected to the doped region; and
   a second electrode electrically connected to the semiconductor material region.

13. The silicon optoelectronic device as claimed in claim 12, wherein the first electrode is a transparent electrode formed on the doped region.

14. The silicon optoelectronic device as claimed in claim 11, wherein the semiconductor material region is thicker than the doped region.

15. The silicon optoelectronic device as claimed in claim 11, wherein the switching portion has a metal-oxide-semiconductor field effect transistor (MOSFET) structure,
   wherein the electrode structure further comprises a second gate electrode and third and fourth electrodes, all of which are provided on the switching portion, and
   wherein one of the third and fourth electrodes is electrically connected to the doped region.

16. The silicon optoelectronic device as claimed in claim 15, wherein the other one of the third and fourth electrodes, and the second electrode act as oppositely charged electrodes.

17. The silicon optoelectronic device as claimed in claim 11, wherein the switching portion has a bipolar junction transistor structure, and
   wherein the electrode structure further comprises base, emitter, and collector electrodes provided in the switching portion.

18. The silicon optoelectronic device as claimed in claim 17, wherein the switching portion is formed by forming a base on the substrate by doping, forming an emitter on the base by doping, and forming a collector on one side of the base by doping.

19. The silicon optoelectronic device as claimed in claim 18, wherein a gap between the boundaries of the base and emitter on the side of the collector is narrow enough.

20. An image input/output device comprising a silicon optoelectronic device panel having a plurality of silicon optoelectronic devices capable of inputting and outputting image arranged on an n- or p-type silicon based substrate in a two-dimensional array, each of the plurality of silicon optoelectronic devices comprising:
   an optoelectronic device portion including
   a doped region doped with a dopant of the opposite type to the substrate on a portion of the substrate, the doped region provided to emit and absorb light, and
   a plurality of semiconductor material regions formed on the rear surface of the substrate,
   wherein a stack structure is formed between at least one portion of the plurality of semiconductor material regions and the doped region,
   the semiconductor material regions adjacent to the substrate have the opposite conductivity type to the substrate, and
   the neighbouring semiconductor material regions have the opposite conductive types to each other so that the optoelectronic device portion has a built-in transistor having at least two steps;

a switching portion formed on one side of the optoelectronic device portion and on the substrate, the switching portion selectively controlling emission and detection of light in the optoelectronic device portion; and an electrode structure performs at least one of supplying an electrical signal to the optoelectronic device portion and switching portion for controlling emission and detection of light to the optoelectronic device portion and switching portion, and outputting a light detetion signal, thus allowing for input and output of image through the same silicon optoelectronic device, and a pattern on the electrode structure to selectively control the input and output of an image to and from the silicon optoelectronic device panel on a pixel-by-pixel basis.

21. The image input/output device as claimed in claim 20, wherein the electrode structure comprises:
   when a semiconductor material region positioned at the outermost side of the portion of the optoelectronic device portion having the stack structure is a first semiconductor material region, and a semiconductor material region adjacent to the inside of the first semiconductor material region is a second semiconductor material region, a first gate electrode electrically connected to the second semiconductor material region;
   a first electrode electrically connected to the doped region; and
   a second electrode electrically connected to the first semiconductor material region.

22. The image input/output device as claimed in claim 21, wherein the first electrode is a transparent electrode formed on the doped region.

23. The image input/output device as claimed in claim 21, wherein the switching portion has a metal-oxide-semiconductor field effect transistor (MOSFET) structure,
   wherein the electrode structure further comprises a second gate electrode and third and fourth electrodes, all of which are provided on the switching portion, and
   wherein one of the third and fourth electrodes is electrically connected to the doped region.

24. The image input/output device as claimed in claim 23, wherein the other one of the third and fourth electrodes, and the second electrode act as oppositely charged electrodes.

25. The image input/output device as claimed in claim 21, wherein the switching portion has a bipolar junction transistor structure, and
   wherein the electrode structure further comprises base, emitter, and collector electrodes provided in the switching portion.

26. The image input/output device as claimed in claim 25, wherein the switching portion is formed by forming a base on the substrate by doping, forming an emitter on the base by doping, and forming a collector on one side of the base by doping.

27. The image input/output device as claimed in claim 26, wherein a gap between the boundaries of the base and emitter on the side of the collector is narrow enough.

28. The image input/output device as claimed in claim 21, wherein the electrode structure further comprises:
an insulating film formed on a portion of the second semiconductor material region; and
a high resistance material layer, on which the first gate electrode is formed, formed on the insulating film and the second semiconductor material region,
wherein the first gate electrode is electrically connected with the second semiconductor material region through the insulating film, with the high resistance material layer being between the first gate electrode and the second semiconductor material region.

29. The image input/output device as claimed in claim 20, wherein the plurality of semiconductor material regions are formed on the rear surface of the substrate by injecting a dopant deeper than dopants for the doped region.

30. The image input/output device as claimed in claim 20, wherein in the silicon optoelectronic device panel, each pixel has at least three silicon optoelectronic devices for emitting and receiving light corresponding thereto.

31. The image input/output device as claimed in claim 30, wherein the at least three silicon optoelectronic devices emit and detect different wavelengths of light for representing a color image.

32. The image input/output device as claimed in claim 30, further comprising a color filter on the front of the silicon optoelectronic device panel.

33. The image input/output device as claimed in claim 20, further comprising a color filter on the front of the silicon optoelectronic device panel.

34. The image input/output device as claimed in claim 30, wherein the image input/output device is responsive to an optical remote control.

35. The image input/output device as claimed in claim 20, wherein the image input/output device is responsive to an optical remote control.

36. An image input/output device comprising a silicon optoelectronic device panel having of a plurality of silicon optoelectronic devices, capable of inputting and outputting images, arranged on an n- or p-type silicon based substrate in a two-dimensional array, each of the plurality of silicon optoelectronic devices comprising:
an n- or p-type silicon-based substrate;
an optoelectronic device portion including
a doped region doped with a dopant of the opposite type to the substrate on a portion of the substrate, the doped region provided to emit and absorb light, and
a semiconductor material region formed on a portion of a rear surface of the substrate, the semiconductor material region has the opposite conductivity type to the substrate and forms a stack structure with the doped region so that the optoelectronic device has a built-in one-step transistor;
a switching portion formed on one side of the optoelectronic device portion and on the substrate, the switching portion selectively controlling emission and detection of light in the optoelectronic device portion; and
an electrode structure for providing at least one of supplying an electrical signal to the optoelectronic device portion and the switching portion for controlling emission and detection, and outputting a light detection signal.

37. The image input/output device as claimed in claim 36, wherein the electrode structure comprises:
a first gate electrode electrically connected to the substrate;
a first electrode electrically connected to the doped region; and
a second electrode electrically connected to the semiconductor material region.

38. The image input/output device as claimed in claim 37, wherein the first electrode is a transparent electrode formed on the doped region.

39. The image input/output device as claimed in claim 37, wherein the switching portion has a metal-oxide-semiconductor field effect transistor (MOSFET) structure,
wherein the electrode structure further comprises a second gate electrode and third and fourth electrodes, all of which are provided on the switching portion, and
wherein one of the third and fourth electrodes is electrically connected to the doped region.

40. The image input/output device as claimed in claim 39, wherein the other one of the third and fourth electrodes, and the second electrode act as oppositely charge electrodes.

41. The image input/output device as claimed in claim 37, wherein the switching portion has a bipolar junction transistor structure, and
wherein the electrode structure further comprises base, emitter, and collector electrodes provided in the switching portion.

42. The image input/output device as claimed in claim 41, wherein the switching portion is formed by forming a base on the substrate by doping, forming an emitter on the base by doping, and forming a collector on one side of the base by doping.

43. The image input/output device as claimed in claim 42, wherein a gap between the boundaries of the base and emitter on the side of the collector is narrow enough.

44. The image input/output device as claimed in claim 36, wherein the semiconductor material region is formed on the rear surface of the substrate by injecting a dopant deeper than dopants for the doped region.

45. The image input/output device as claimed in claim 36, wherein in the silicon optoelectronic device panel, each pixel has at least three silicon optoelectronic devices for emitting and detecting light corresponding thereto.

46. The image input/output device as claimed in claim 45, wherein the at least three silicon optoelectronic devices emit and detect different wavelengths of light for representing a color image.

47. The image input/output device as claimed in claim 46, further comprising a color filter on the front of the silicon optoelectronic device panel.

48. The image input/output device as claimed in claim 45, further comprising a color filter on the front of the silicon optoelectronic device panel.

49. The image input/output device as claimed in claim 45, wherein the image input/output device is responsive to an optical remote control.

50. The image input/output device as claimed in claim 36, wherein the image input/output device is responsive to an optical remote control.

* * * * *